(12) United States Patent
Chibana

(10) Patent No.: US 7,742,147 B2
(45) Date of Patent: Jun. 22, 2010

(54) EXPOSURE APPARATUS

(75) Inventor: Takahito Chibana, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 489 days.

(21) Appl. No.: 11/548,011

(22) Filed: Oct. 10, 2006

(65) Prior Publication Data

US 2007/0085990 A1      Apr. 19, 2007

(30) Foreign Application Priority Data

Oct. 11, 2005    (JP)    ............................. 2005-296956

(51) Int. Cl.
  *G03B 27/52*    (2006.01)
  *G03B 27/42*    (2006.01)
  *G03B 27/58*    (2006.01)
(52) U.S. Cl. .............................. 355/30; 355/53; 355/72
(58) Field of Classification Search .................. 355/30,
    355/52, 55, 53, 72–74, 77; 250/492.1, 492.2,
    250/492.22, 548; 430/30, 311, 312
    See application file for complete search history.

(56) References Cited

U.S. PATENT DOCUMENTS

| | | | | | |
|---|---|---|---|---|---|
| 4,814,625 | A | * | 3/1989 | Yabu ........................... | 250/548 |
| 5,469,260 | A | * | 11/1995 | Takagi et al. ................. | 356/500 |
| 5,559,584 | A | * | 9/1996 | Miyaji et al. .................. | 355/73 |
| 5,870,198 | A | * | 2/1999 | Takagi ......................... | 356/500 |
| 5,963,324 | A | * | 10/1999 | Murata ........................ | 356/509 |
| 6,665,046 | B2 | * | 12/2003 | Nogawa et al. ............... | 355/30 |
| 6,952,253 | B2 | * | 10/2005 | Lof et al. ..................... | 355/30 |
| 7,057,701 | B2 | | 6/2006 | Chibana et al. ............... | 355/30 |
| 7,075,616 | B2 | | 7/2006 | Derksen et al. ............... | 355/30 |

(Continued)

FOREIGN PATENT DOCUMENTS

JP           6-124873           5/1994

(Continued)

OTHER PUBLICATIONS

English translation of Japanese Office Action dated Oct. 1, 2007, issued in corresponding Japanese patent application No. 2005-296956.

*Primary Examiner*—Peter B Kim
*Assistant Examiner*—Christina Riddle
(74) *Attorney, Agent, or Firm*—Fitzpatrick, Cella, Harper & Scinto

(57) ABSTRACT

An exposure apparatus for measuring a position of a stage, configured to hold a substrate, using a laser interferometer, and exposing the substrate through an original, and an optical element opposite to the substrate with a gap between the optical element and the substrate filled with liquid. A first supply nozzle is arranged around the optical element, which supplies the liquid to the gap, a first recovery nozzle arranged around the first supply nozzle recovers the liquid from the gap, a second supply nozzle supplies a gas outside the first recovery nozzle, a controller controls an amount of the liquid supplied from the first supply nozzle and an amount of the liquid and gas recovered from the first recovery nozzle, and a wall portion is arranged around the optical element and substantially parallel to a surface of the substrate. If Q1 is the amount of the liquid supplied from the first supply nozzle and Q2 is a sum of the amount of the liquid and gas recovered from the first recovery nozzle, a relationship Q1<Q2 is satisfied.

6 Claims, 20 Drawing Sheets

U.S. PATENT DOCUMENTS

| | | | |
|---|---|---|---|
| 7,081,943 B2 | 7/2006 | Lof et al. | 355/30 |
| 7,110,081 B2 | 9/2006 | Hoogendam et al. | 355/30 |
| 7,119,874 B2 * | 10/2006 | Cox et al. | 355/30 |
| 7,193,232 B2 | 3/2007 | Lof et al. | 250/548 |
| 7,199,858 B2 | 4/2007 | Lof et al. | 355/30 |
| 7,213,963 B2 | 5/2007 | Lof et al. | 366/53 |
| 7,218,377 B2 | 5/2007 | Chibana | 355/30 |
| 7,224,436 B2 | 5/2007 | Derksen et al. | 355/53 |
| 2002/0000029 A1 * | 1/2002 | Emoto | 29/25.01 |
| 2002/0130276 A1 * | 9/2002 | Sogard | 250/492.2 |
| 2004/0207824 A1 * | 10/2004 | Lof et al. | 355/30 |
| 2004/0257544 A1 * | 12/2004 | Vogel et al. | 355/30 |
| 2005/0007569 A1 | 1/2005 | Streefkerk et al. | 355/30 |
| 2005/0036121 A1 * | 2/2005 | Hoogendam et al. | 355/30 |
| 2005/0078287 A1 | 4/2005 | Sengers et al. | 355/30 |
| 2005/0105067 A1 * | 5/2005 | Chibana | 355/30 |
| 2005/0153424 A1 * | 7/2005 | Coon | 435/287.1 |
| 2005/0259234 A1 * | 11/2005 | Hirukawa et al. | 355/53 |
| 2006/0012765 A1 * | 1/2006 | Kameyama | 355/53 |
| 2006/0023189 A1 | 2/2006 | Lof et al. | 355/53 |
| 2006/0033892 A1 * | 2/2006 | Cadee et al. | 355/53 |
| 2006/0033898 A1 * | 2/2006 | Cadee et al. | 355/53 |
| 2006/0038968 A1 * | 2/2006 | Kemper et al. | 355/18 |
| 2006/0132737 A1 | 6/2006 | Magome et al. | 355/53 |
| 2006/0146305 A1 * | 7/2006 | Magome et al. | 355/53 |
| 2006/0215137 A1 * | 9/2006 | Hasegawa et al. | 355/53 |
| 2006/0232756 A1 | 10/2006 | Lof et al. | 355/53 |
| 2006/0268250 A1 | 11/2006 | Maria Derksen et al. | 355/53 |
| 2006/0290908 A1 * | 12/2006 | De Graaf et al. | 355/53 |
| 2007/0040133 A1 | 2/2007 | Lof et al. | 250/548 |
| 2007/0085990 A1 | 4/2007 | Chibana | 355/53 |
| 2007/0132970 A1 | 6/2007 | Lof et al. | 355/53 |
| 2007/0132971 A1 | 6/2007 | Sengers et al. | 355/53 |
| 2007/0132979 A1 | 6/2007 | Lof et al. | 355/69 |
| 2007/0146663 A1 * | 6/2007 | Nagasaka | 355/53 |
| 2007/0159608 A1 | 7/2007 | Chibana | 355/30 |
| 2007/0268471 A1 | 11/2007 | Lof et al. | 355/53 |

FOREIGN PATENT DOCUMENTS

| | | |
|---|---|---|
| JP | 10-303114 | 11/1998 |
| JP | 2001-44112 | 2/2001 |
| JP | 2004-289126 | 10/2004 |
| JP | 2005-183744 | 7/2005 |
| JP | 2005-223315 | 8/2005 |
| JP | 2005-268742 | 9/2005 |
| WO | WO 99/49504 | 9/1999 |
| WO | WO 2004/086470 A1 | 10/2004 |
| WO | WO 2004086470 A1 * | 10/2004 |
| WO | WO 2005010962 A1 * | 2/2005 |
| WO | WO 2005067013 A1 * | 7/2005 |

\* cited by examiner

F I G. 14
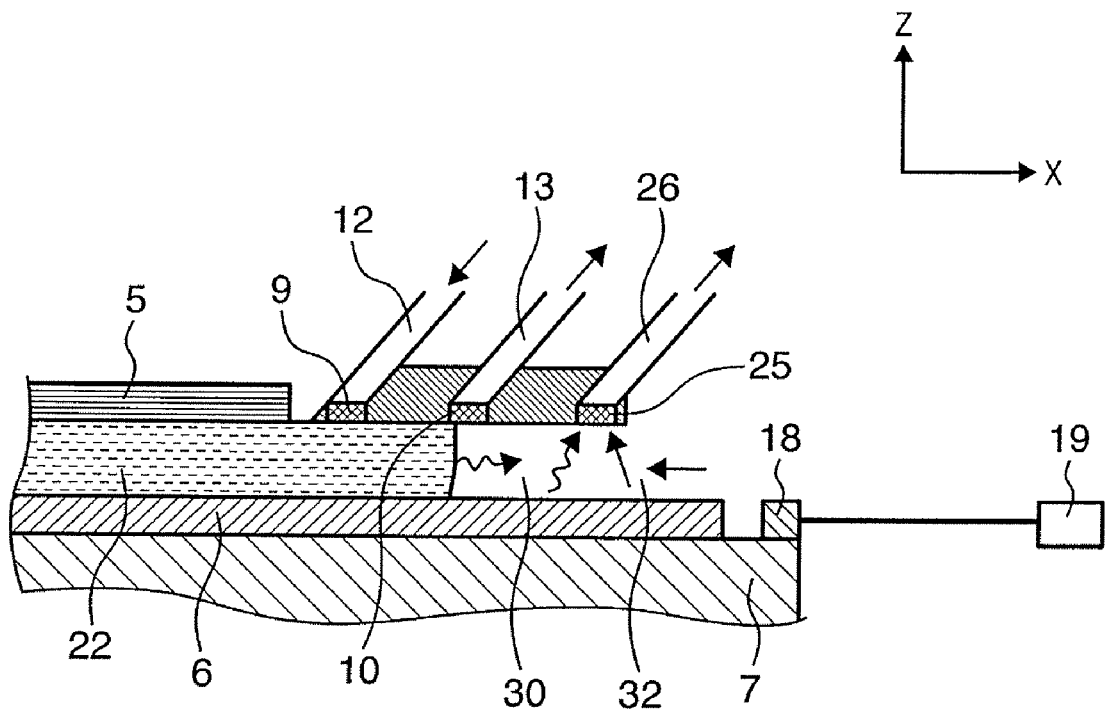

EXPOSURE APPARATUS

This application claims the benefit of Japanese Patent Application No. 2005-296956, filed Oct. 11, 2005, which is hereby incorporated by reference herein in its entirety.

BACKGROUND OF THE INVENTION

1. Field of the Invention

The present invention relates to an exposure technique for exposing a substrate to light with a gap between a projection optical system and the substrate filled with liquid.

2. Description of the Related Art

A process for manufacturing a semiconductor device formed from a micropattern of an LSI or VLSI adopts a reduction projection exposure apparatus which reduces a pattern formed on a mask and projects and transfers it onto a substrate coated with a photosensitive agent. As the degree of integration of a semiconductor device increases, further micropatterning becomes necessary. The exposure apparatus has coped with micropatterning along with the development of the resist process.

To increase the resolving power of an exposure apparatus, it is a common practice to shorten the exposure wavelength or to increase the numerical aperture (NA) of a projection optical system.

As for the wavelength of exposure light, a shift, from a 365-nm i-line to KrF excimer laser light having an oscillation wavelength around 248 nm, is in progress, and an ArF excimer laser having an oscillation wavelength around 193 nm is under development. A fluorine ($F_2$) excimer laser having an oscillation wavelength around 157 nm is also under development.

On the other hand, a liquid immersion method or liquid immersion lithography is receiving a great deal of attention as a technique for increasing the resolving power in a completely different way from the above methods. The conventional methods fill, with a gas, the space between the end face of a projection optical system and the surface of an exposure target substrate (e.g., a wafer). However, the liquid immersion method executes projection exposure while filling that space with a liquid. Assume, for example, that the liquid immersion method uses pure water (refractive index: 1.44) as the liquid to be supplied to the space between the projection optical system and the wafer, and sets the maximum incident angle of a light beam imaged on the wafer equal to that in the conventional methods. In this case, the liquid immersion method can advantageously attain a resolving power 1.44 times that in the conventional methods even by using a light source having the same wavelength. This amounts to increasing the NA of the projection optical system in the conventional methods to 1.44 times. The liquid immersion method can attain a resolving power whose NA is one or more, which is practically impossible in the conventional methods.

An attempt to apply the liquid immersion method to an exposure apparatus is recently in progress. For example, Japanese Patent Application Laid-Open No. 6-124873 discloses a prior art exposure apparatus to which the liquid immersion method is applied. FIG. 17A is a side view showing the structure of the exposure apparatus disclosed in Japanese Patent Application Laid-Open No. 6-124873. Referring to FIG. 17A, filling a liquid tank (chamber) 109 with a liquid 130 provides the ability to fill, with the liquid 130, the space between a wafer 102 and the end face (an optical element 107) of a projection optical system 104. The liquid tank 109 accommodates a wafer transfer device, wafer chuck 112, X-Y stage 113, fine moving stage 114, and part of or all of each of coarse alignment devices 111-1 to 111-4. The wafer transfer device loads the wafer 102 from a wafer cassette 110 and sets it on the wafer chuck 112.

Reference numeral 115 denotes a laser interferometer. A reference mirror 116 is attached to the surface of the fine moving stage 114 along the X and Y directions (the Y direction is not shown), and reflects light from the laser interferometer 115 to measure the position of the fine moving stage 114. The liquid tank 109 has a window 117, which passes light from the laser interferometer 115. A heat-insulating material 118 is formed outside the liquid tank 109 and thermally insulates the liquid tank 109 from outside.

As shown in FIG. 17B, Japanese Patent Application Laid-Open No. 6-124873 describes another arrangement example of the exposure apparatus designed to mount the liquid tank 109 on the fine moving stage 114 while placing, in the liquid tank 109, only constituent parts, including the wafer chuck 112, or while directly placing the wafer chuck 112 on the bottom surface of the liquid tank 109. That is, Japanese Patent Application Laid-Open No. 6-124873 describes an exposure apparatus using a method of mounting, in the liquid tank 109, the whole wafer 102 and the end face of the projection optical system 104.

International Publication No. WO99/049504 describes still another example in which the liquid immersion method is applied to an exposure apparatus. International Publication No. WO99/049504 describes an exposure apparatus using a method of supplying a liquid to only the space between a projection optical system and the wafer surface, so as to fill that space.

This method uses a laser interferometer to measure the position of a stage. However, the laser interferometer suffers from a measurement error, due to a change in refractive index of a gas (to be referred to as an ambient gas hereinafter) on its measurement optical path, along with changes in its composition, temperature, and humidity.

For example, an amount $\Delta n$ of a change in refractive index due to a change in humidity of the ambient gas is expressed by $\Delta n = Ke \cdot \Delta e$ where Ke is a coefficient, and $\Delta e$ (%) is the amount of change in humidity. The coefficient Ke is a constant, which depends on the type of ambient gas used, and the wavelength of a laser used. If, for example, the ambient gas is air, and the light source uses a He—Ne laser, Ke=1E-8 approximately holds. Hence, when the humidity of the ambient gas has changed by 1%, the amount of change in refractive index satisfies:

$$\Delta n = 1E\text{-}8 * 1 = 1E\text{-}8.$$

At this time, if the length of the measurement optical path of the laser interferometer is 1 m, a measurement error $\Delta L$ is:

$$\Delta L = 1E\text{-}8 * 1 = 10 \text{ nm}.$$

Accordingly, it is necessary for an exposure apparatus, to which the conventional liquid immersion method is applied, that a change in refractive index of an ambient gas never influences the measurement accuracy of the laser interferometer. Additionally, to reduce a change in refractive index of the ambient gas on the measurement optical path of the laser interferometer, that exposure apparatus seeks to reduce changes in temperature and humidity of the ambient gas on the measurement optical path of the laser interferometer.

For example, the exposure apparatus in Japanese Patent Application Laid-Open No. 6-124873, having the structure shown in FIG. 17A, provides the ability to prevent the influence of a change in refractive index of an ambient gas on the measurement accuracy of the laser interferometer 115, by directly attaching the laser interferometer 115 to the side surface of the liquid tank 109, as shown in FIG. 17C.

Japanese Patent Application Laid-Open No. 10-303114 exemplifies a technique for reducing changes in temperature and humidity of an ambient gas on the measurement optical path of a laser interferometer. FIG. 18 is a side view showing the structure of an exposure apparatus disclosed in Japanese Patent Application Laid-Open No. 10-303114. At a predetermined height, a wall portion LB is formed on the entire outer peripheral portion of a holder table WH which holds a wafer W. The inner side of the wall portion LB is filled with a liquid LQ at a predetermined depth.

For an exposure scheme, which causes the laser interferometer to project a reference beam BSr onto a reference mirror ML of a projection lens system PL, Japanese Patent Application Laid-Open No. 10-303114 describes a technique for preventing a fluctuation in the optical path of the reference beam BSr by interposing a cover plate 287 between the optical path of the reference beam BSr and the liquid LQ, so as to cut off the flow of the vapor ascending from the liquid LQ.

As described above, an exposure apparatus to which the liquid immersion method is applied seeks to reduce changes in temperature and humidity of a gas on the measurement optical path or to prevent a change in refractive index of the ambient gas from influencing the measurement accuracy of the laser interferometer.

However, it is necessary for the exposure apparatus disclosed in Japanese Patent Application Laid-Open No. 6-124873 to directly attach the laser interferometer 115 to the side surface of the liquid tank 109, as shown in FIG. 17C, in order to prevent a change in refractive index of the ambient gas from influencing the measurement accuracy of the laser interferometer. It is also necessary to place, in the liquid tank 109, the wafer 102, wafer chuck 112, X-Y stage 113, fine moving stage 114, and part of or all of each of coarse alignment devices 111-1 to 111-4. This complicates the apparatus and increases its size, resulting in an increase in its cost.

Additionally, as shown in FIG. 17B, when the wafer 102 and wafer chuck 112 alone are placed in the liquid tank 109, the vapor produced from the liquid 130 changes the composition of an ambient gas on the measurement optical path of the laser interferometer 115. This changes the refractive index of the ambient gas, resulting in degradation in measurement accuracy of the laser interferometer 115. Especially, if the liquid 130 is pure water, not only does the composition of the ambient gas, but also, the humidity of the ambient gas, greatly changes. This causes a larger change in refractive index, so the laser interferometer 115 suffers from a measurement error that is absolutely unallowable.

For the sake of simplicity, the expression that the refractive index of an ambient gas on the measurement optical path of a laser interferometer actually changes indicates the following phenomenon. That is, the refractive index of an ambient gas on the measurement optical path of a laser interferometer changes due to a change in composition and/or humidity of the ambient gas. The expression that the vapor of a liquid from the space between a projection optical system and the wafer surface influences an ambient gas on the measurement optical path of a laser interferometer actually indicates the following phenomenon. That is, the vapor of a liquid from the space between a projection optical system and the wafer surface leaks out onto the measurement optical path of a laser interferometer and, therefore, the refractive index of an ambient gas on the measurement optical path changes.

The exposure apparatus discussed in international Publication WO99/049504 does not consider any vapor of the liquid from the space between the projection optical system and the wafer surface. Therefore, the vapor produced from the liquid from the space between the projection optical system and the wafer surface changes the refractive index of the ambient gas on the measurement optical path of the laser interferometer. The laser interferometer suffers from a measurement error. Consequently, the apparatus often manufactures a defective semiconductor element, resulting in degradation in its productivity.

Since the exposure apparatus in Japanese Patent Application Laid-Open No. 10-303114 mounts the cover plate 287, it is possible to prevent a fluctuation in the optical path of the reference beam BSr. However, the vapor of the liquid LQ still influences a measurement beam BSm, so the fundamental problem remains.

SUMMARY OF THE INVENTION

The present invention has been made in consideration of the above background, and has as its exemplary object to provide an exposure technique for reducing the influence that vapor, produced from liquid under a projection optical system, exerts on the ambience.

In order to achieve the above object, according to the present invention, an exposure apparatus comprises a projection optical system configured to project light from a reticle onto a substrate, wherein the apparatus is configured to expose the substrate to the light with a gap between the projection optical system and the substrate filled with liquid, a first supply nozzle arranged around a final optical element of the projection optical system and configured to supply the liquid to the gap, a first recovery nozzle arranged around the first supply nozzle and configured to recover the liquid from the gap, and a second supply nozzle arranged in at least a part of a region around the first recovery nozzle and configured to supply a gas so as to form a gas curtain, wherein letting Q1 be a flow rate of the liquid supplied from the first supply nozzle, and Q2 be a sum of flow rates of the liquid and gas recovered from the first recovery nozzle, the apparatus is configured to satisfy a relationship Q1<Q2.

Preferably, an apparatus defined above comprises, in place of the second supply nozzle, a second recovery nozzle configured to recover gas.

Preferably, an exposure apparatus defined above further comprises a stage configured to hold the substrate and to move, and a second wall arranged around the final optical element so as to face the stage, wherein the second supply nozzle is arranged in the stage.

Preferably, the second wall includes a portion which transmits the light.

Preferably, an apparatus defined above comprises, in place of the second supply nozzle arranged in the stage, a second supply nozzle arranged in the second wall and configured to supply gas.

Preferably, an apparatus defined above comprises, in place of the second supply nozzle, a second recovery nozzle configured to recover gas.

There is also provided an exposure apparatus comprising a projection optical system configured to project light from a reticle onto a substrate, wherein the apparatus is configured to expose the substrate to the light with a gap between the projection optical system and the substrate filled with liquid, a supply nozzle arranged around a final optical element of the projection optical system and configured to supply the liquid to the gap, a recovery nozzle arranged around the supply nozzle and configured to recover the liquid from the gap, and a suction nozzle configured to suck in a fluid, the suction nozzle being arranged around the recovery nozzle and being a nozzle most spaced apart from the supply nozzle.

There is also provided a method of manufacturing a device, the method comprising steps of exposing a substrate to light via a reticle using an exposure apparatus as defined above, developing the exposed substrate, and processing the developed substrate to manufacture the device.

According to the present invention, it is possible to reduce the influence of vapor produced from a liquid under a projection optical system on the ambience.

Further features of the present invention will become apparent from the following description of exemplary embodiments (with reference to the attached drawings).

BRIEF DESCRIPTION OF THE DRAWINGS

FIG. 14 is a schematic view showing currents of a vapor and a gas around the wafer;

DESCRIPTION OF THE EMBODIMENTS

Embodiments according to the present invention will be described in detail below with reference to the accompanying drawings.

Note that the embodiments to be described hereinafter are merely practical examples of the present invention and can be appropriately modified or changed in accordance with various conditions, and the arrangement of an apparatus to which the present invention is applied.

The present invention is achieved even by supplying a storage medium (or recording medium) which stores software program codes for implementing an immersion liquid supply control method and an exposure method according to the embodiments to be described later, to the system or apparatus, and causing the computer (or CPU or MPU) of the system or apparatus to read out and to execute the program codes stored in the storage medium.

First Embodiment

Figure 1:
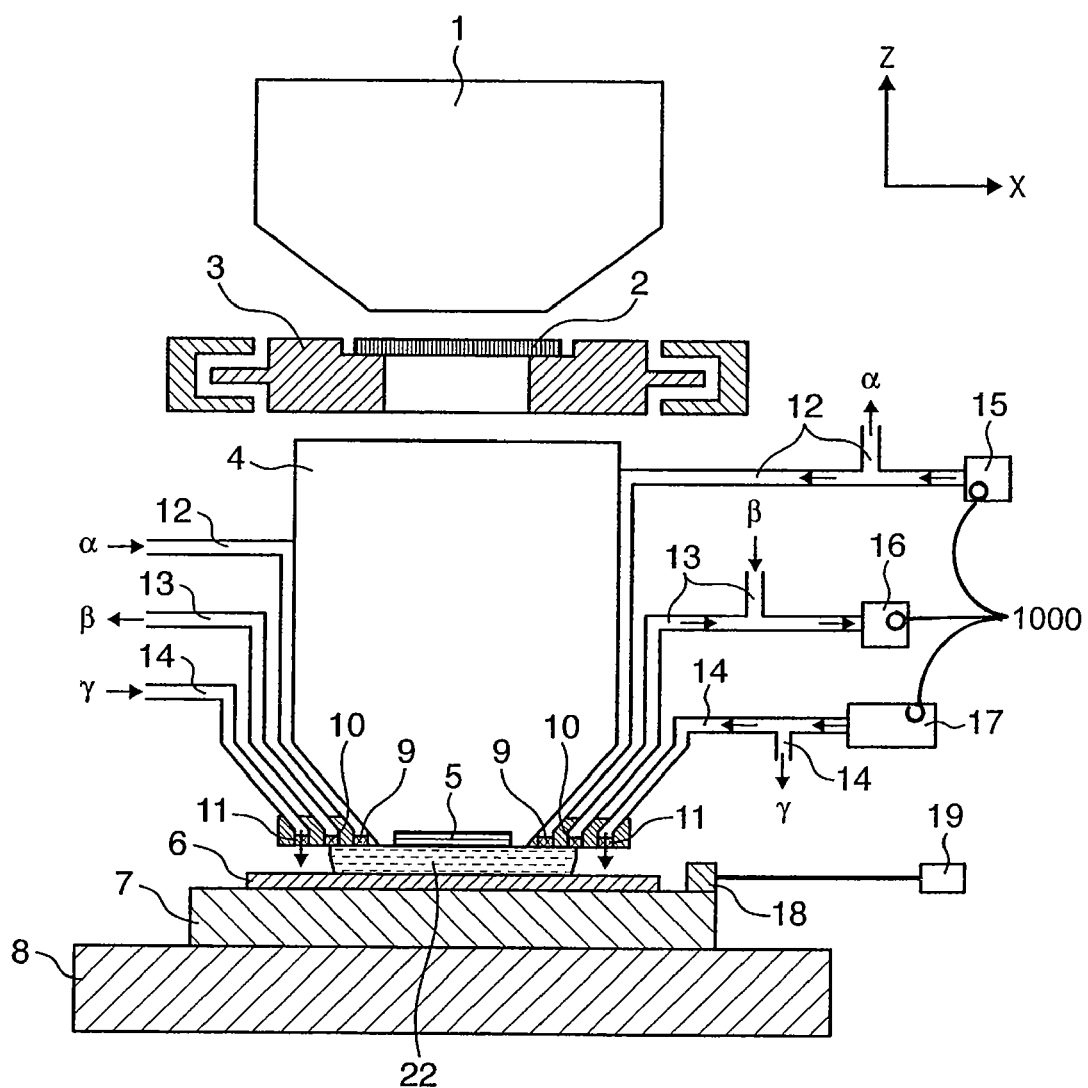
FIG. 1 is a side view showing the schematic structure of a projection exposure apparatus according to a first embodiment of the present invention.

FIG. 1 is a schematic side view showing a step and scan projection exposure apparatus according to the embodiment of the present invention.

Referring to FIG. 1, an exposure light source (not shown), such as an ArF excimer laser or an $F_2$ excimer laser supplies light to an illumination optical system 1. The illumination optical system 1 partially illuminates a reticle (which is also called a mask or original plate) 2 with the light which is supplied from the exposure light source, and formed into slit light (light having a slit-shaped cross section). While the illumination optical system 1 illuminates the reticle 2 with the slit light, a reticle stage (original plate stage) 3, which holds the reticle 2, and a wafer stage (substrate stage) 7, which holds a wafer (substrate) 6, move by scanning in synchronism with each other. The sync scanning provides the ability to continuously image, on the wafer 6, the entire pattern on the reticle 2 through a projection optical system 4, so as to expose the resist applied to the surface of the wafer 6 to light.

Figure 2:
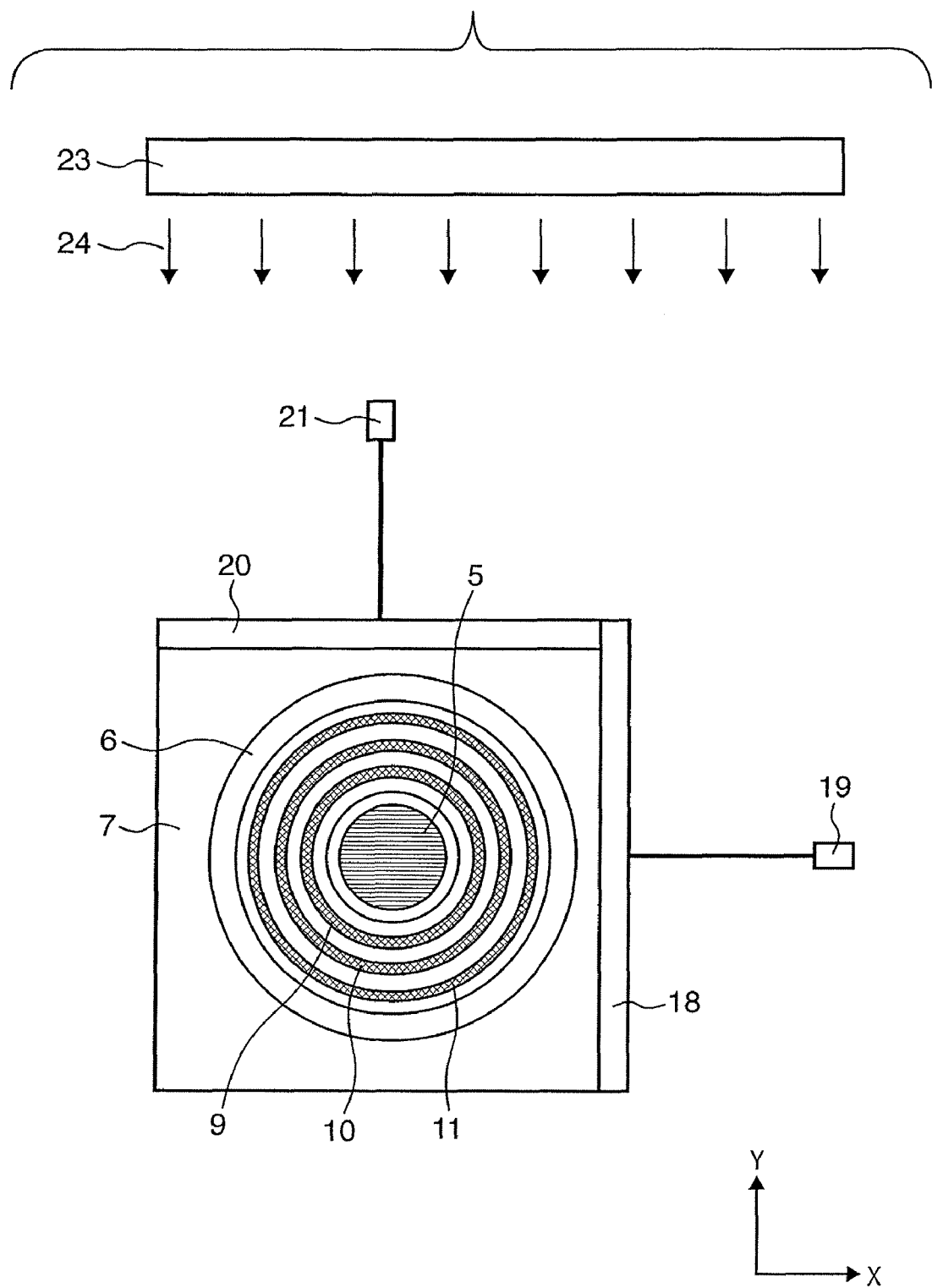
FIG. 2 is a plan view showing the schematic structure of the projection exposure apparatus near a wafer stage according to the first embodiment of the present invention.

Also referring to FIG. 1, an X-direction measurement mirror 18 is fixed to the wafer stage 7, and an X-direction laser interferometer 19 measures the X-direction position of the wafer stage 7. As shown in FIG. 2, the same applies to the Y direction. A Y-direction measurement mirror 20 is fixed to a first recovery nozzle 10, and a Y-direction laser interferometer 21 measures the Y-direction position of the wafer stage 7. FIG. 2 is a plan view of the exposure apparatus shown in FIG. 1, when cut away on the upper side from an optical element 5 and seen from above. Similarly, the reticle stage 3 has a measurement mirror (not shown), and a laser interferometer (not shown) measures the position of the reticle stage 3.

The laser interferometers measure the positions of the reticle stage 3 and wafer stage 7 in real time. On the basis of the measured values, a controller (not shown) aligns and synchronously controls the reticle 2 (reticle stage 3) and wafer 6 (wafer stage 7). The wafer stage 7 incorporates a driving device to adjust or to change the position along the up/down direction (vertical direction), the rotational direction, and the inclination of the wafer 6. In exposure, the driving device controls the wafer stage 7, such that the exposure area on the wafer 6 always matches the focal plane of the projection optical system 4 with high accuracy. At this time, a light focus sensor (not shown) measures the position (the inclination and the position along the up/down direction) of the plane on the wafer 6 and sends the measurement result to the controller (not shown).

An ambient chamber (not shown) accommodates the exposure apparatus main body to hold its ambient gas at a predetermined temperature.

Furthermore, as shown in FIG. 2, a conditioner 23 to blow a gas faces the reflection surface of the Y-direction measurement mirror 20. The conditioner 23 controls the temperature and humidity of a conditioned gas 24, and blows it into the space which surrounds the laser interferometers 19 and 21, so as to maintain the temperature and humidity of an ambient gas on the measurement optical paths of the laser interferometers 19 and 21 with a higher accuracy. Although not shown, the reticle stage 3 has a similar conditioner to highly accurately maintain the ambient temperature of the space which surrounds the laser interferometer (not shown), to measure the position of the reticle stage 3.

A first supply nozzle 9 to supply a liquid surrounds the periphery of the optical element 5 and is connected to a liquid supply device 15 through a supply pipe 12. The first recovery nozzle 10 to recover a liquid and gas surrounds the first supply nozzle 9, and is connected to a liquid and gas recovery device 16 through a recovery pipe 13. In this case, the optical element 5, first supply nozzle 9, and first recovery nozzle 10 exist in the same plane.

The liquid supply device 15 may include, e.g., a tank to store a liquid, a pressure feed device to feed the liquid, and a flow controller 1000 to control the flow rate of the liquid to be supplied. Preferably, the liquid supply device 15 further includes a temperature controller to control the temperature of the liquid to be supplied. The liquid and gas recovery device 16 may include, e.g., a tank to separate and to temporarily store the recovered liquid and gas, a suction device to draw the liquid and gas by suction, and the flow controller 1000 to control the flow rates of the liquid and gas to be recovered.

Desirably, an immersion liquid hardly absorbs exposure light, and has a refractive index almost the same as that of an optical element as a dioptric system made of quartz or fluorite. More specifically, the immersion liquid may be, e.g., pure water, functional water, or a fluorinated liquid (e.g., fluorocarbon). Preferably, a degassing device sufficiently removes dissolved gases from the immersion liquid in advance. This is to suppress generation of bubbles, and additionally, to immediately absorb bubbles if they are, in fact, generated. Assume, for example, that the gases used are nitrogen and oxygen contained in the air in large quantities. When the degassing device removes each gas from the liquid by 80% or more of its dissolution limit, it is possible to sufficiently suppress the generation of bubbles. The exposure apparatus may comprise a degassing device (not shown) to supply a liquid to the liquid supply device 15, while always removing dissolved gases from the liquid. Preferably, the degassing device is, e.g., a vacuum degassing device to supply a liquid to one side of a space partitioned by a gas permeable film and to set the other side in a vacuum state, so as to discharge the dissolved gases from the liquid through the film.

A second supply nozzle 11 supplies a gas to the vicinity of the wafer or wafer stage. The second supply nozzle 11 surrounds the first recovery nozzle 10, and is connected to a gas supply device 17 through a supply pipe 14. The gas supply device 17 may include, e.g., a tank to store a gas, a flow controller 1000 to control the flow rate of the gas to be supplied, and a controller to control the temperature and humidity of the gas to be supplied. The second supply nozzle 11 need not always exist in the same plane as that of the first supply nozzle 9 and first recovery nozzle 10. The second supply nozzle 11 may exist on the upper or lower side from the plane in which the first supply nozzle 9 and first recovery nozzle 10 are formed.

The exposure apparatus according to this embodiment fills, with a liquid 22 supplied from the first supply nozzle 9, the space between the wafer 6 and the optical element 5, at the end face of the projection optical system 4. The first recovery nozzle 10 recovers the liquid 22. A gas supplied from the second supply nozzle 11 forms a gas curtain. Let Q1 be the flow rate of the liquid supplied from the first supply nozzle 9, and Q2 be the sum total of the flow rates of the liquid and gas recovered from the first recovery nozzle 10. The controllers of the liquid supply device 15 and liquid and gas recovery device 16 control the flow rates Q1 and Q2 to satisfy Q1<Q2. This makes it possible to surely form a current of the gas from the second supply nozzle 11 to the first recovery nozzle 10, so as to reduce the influence of the vapor produced from the liquid 22 on the ambient gas on the measurement optical paths of the laser interferometers. The flow control is similarly applicable to exposure apparatuses according to modifications to the first embodiment and the second to fourth embodiments to be described later.

Let Q3 be the flow rate of the gas supplied from the second supply nozzle 11. Depending on the gap between the wafer 6 and the optical element 5, first supply nozzle 9, first recovery nozzle 10, or second supply nozzle 11, flow rates Q1 to Q3 suitable to reduce the influence of the vapor of the liquid 22, on the measurement optical paths of the laser interferometers, change. Assume, for example, that all of the optical element 5, first supply nozzle 9, first recovery nozzle 10, and second supply nozzle 11 exist in the same plane, and the gap between that plane and the wafer 6 is 1 mm. If the flow rates Q1, Q2, and Q3 are 1 L/min, 3 L/min, and 2 L/min, respectively, it is possible to sufficiently reduce the influence of the vapor of the liquid 22 on the periphery of the wafer stage.

First Modification

Figure 3:
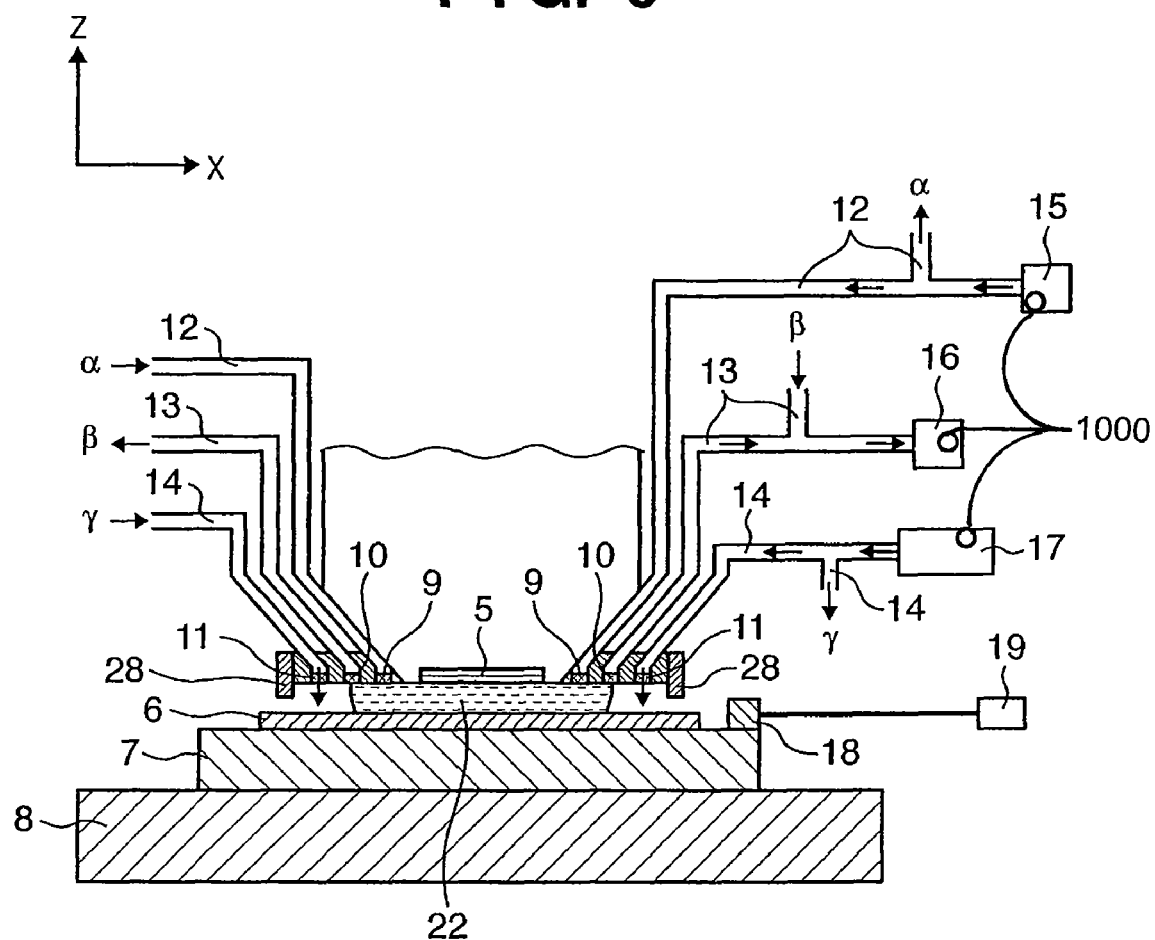
FIG. 3 is a side view showing the schematic structure of a projection exposure apparatus near the wafer stage according to a first modification to the first embodiment of the present invention.

In order to more effectively form a current of a gas from the second supply nozzle 11 to the first recovery nozzle 10, a first wall portion 28 may stand upright, so as to surround the second supply nozzle 11 from its outside as shown in FIG. 3. FIG. 3 is a side view showing the schematic structure near the wafer stage according to a modification to the first embodiment. The same reference numerals as those in FIGS. 1 and 2 denote the same constituent components in FIG. 3. An exposure apparatus shown in FIG. 3 is different from that shown in FIGS. 1 and 2 in that the first wall portion 28 stands upright, so as to surround the second supply nozzle 11, in addition to the structure of the exposure apparatus shown in FIGS. 1 and 2.

The exposure apparatus shown in FIG. 3 holds the gap between the first wall portion 28 and the wafer 6 to be narrower than that between the second supply nozzle 11 and the wafer 6. Arranging the first wall portion 28 in this manner makes it possible to positively form a current of a gas from the second supply nozzle 11 to the first recovery nozzle 10. This makes it possible to more surely prevent the vapor of the liquid 22 from leaking out to the periphery of the wafer stage.

Second Modification

Figure 4:
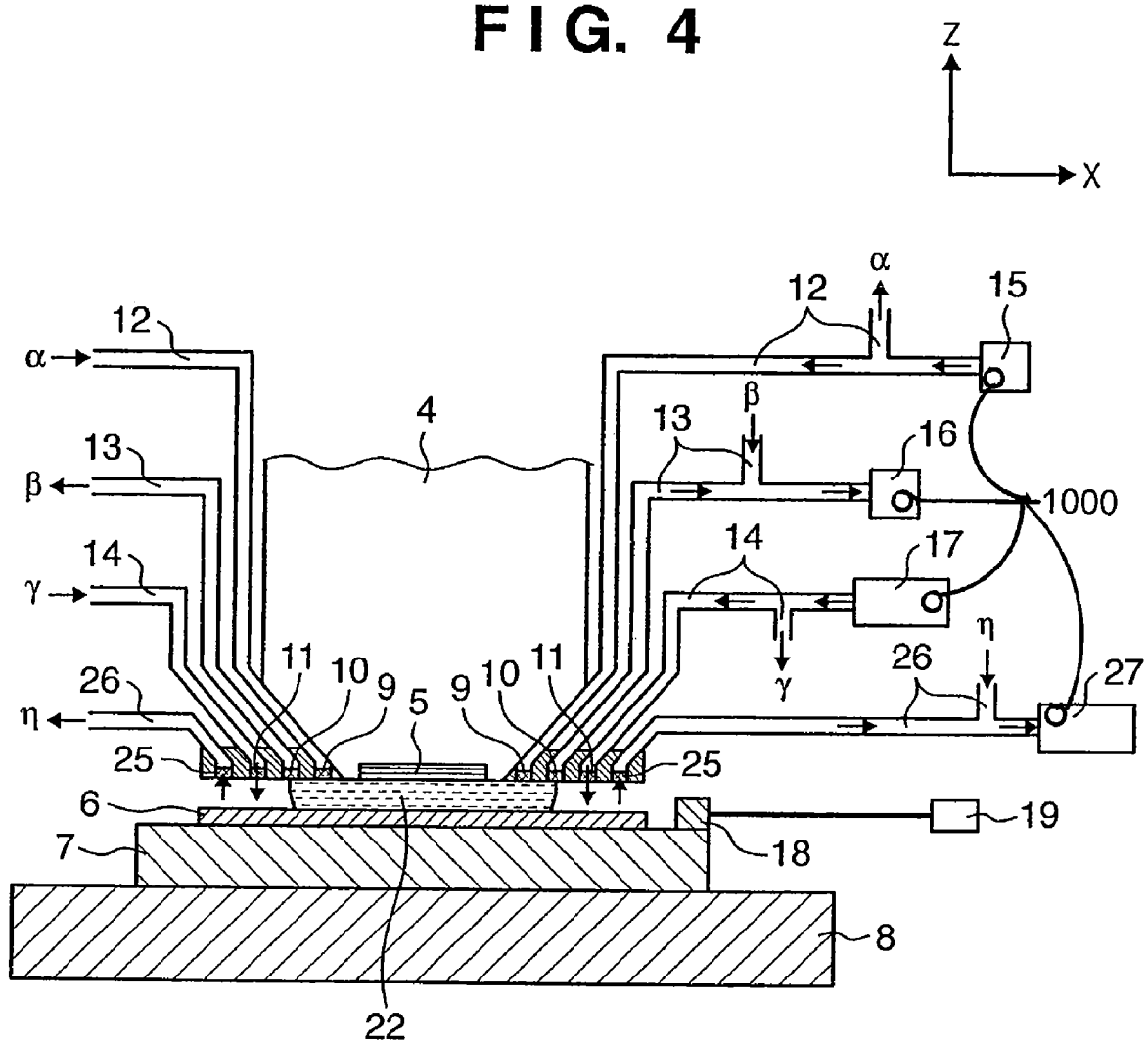
FIG. 4 is a side view showing the schematic structure of a projection exposure apparatus near the wafer stage according to a second modification to the first embodiment of the present invention.

Even when the exposure apparatuses shown in FIGS. 1 to 3 can prevent the vapor of the liquid 22 from leaking out onto the measurement optical paths of the laser interferometers, the gas supplied from the second supply nozzle 11 may change the composition of the ambient gas on the measurement optical paths of the laser interferometers, resulting in a change in refractive index of the ambient gas. To reduce this change, a second recovery nozzle 25 to recover a gas may surround the second supply nozzle 11, as shown in FIG. 4. FIG. 4 is a side view showing the schematic structure near the wafer stage 7 according to the second modification to the first embodiment. The same reference numerals as those in FIGS. 1 and 2 denote the same constituent components in FIG. 4. An exposure apparatus shown in FIG. 4 is different from that shown in FIGS. 1 and 2 in that the second recovery nozzle 25 surrounds the second supply nozzle 11, in addition to the structure of the exposure apparatus shown in FIGS. 1 and 2.

The exposure apparatus shown in FIG. 4 is designed to connect the second recovery nozzle 25 to a gas recovery device 27 through a recovery pipe 26. The gas recovery device 27 may include a vacuum generator to recover a gas and a flow controller 1000 to control the flow rate of the gas to be recovered. The vacuum generator to recover the gas should adopt a type which minimizes pulsation (a pressure change), so as to avoid its influence on the performance of the gas around the second recovery nozzle 25. For example, a scroll type vacuum pump or a vacuum ejector, which generates a vacuum by utilizing a pressurized gas, is preferable. Alternatively, a tank may suppress the pulsation.

The exposure apparatus shown in FIG. 4 allows the second recovery nozzle 25 to recover the gas supplied from the second supply nozzle 11. This makes it possible to decrease the amount of gas which leaks out onto the measurement optical paths of the laser interferometers, so as to reduce a change in density of the ambient gas on the measurement optical paths of the laser interferometers.

Letting Q4 be the flow rate of the gas recovered from the second recovery nozzle 25, control to make the flow rate Q4 and the flow rate Q3 of the gas supplied from the second supply nozzle 11 satisfy Q3<Q4 is preferable. With this control, the second recovery nozzle 25 can almost completely recover the gas supplied from the second supply nozzle 11. Consequently, the gas supplied from the second supply nozzle 11 never leaks out onto the measurement optical paths of the laser interferometers. This makes it possible to prevent a change in refractive index of the ambient gas on the measurement optical paths of the laser interferometers.

Obviously, the second recovery nozzle 25 of the exposure apparatus as shown in FIG. 4 is applicable to the exposure apparatus shown in FIG. 3. When the second recovery nozzle 25 is applied to the exposure apparatus shown in FIG. 3, the second recovery nozzle 25 may be arranged between the second supply nozzle 11 and the first wall portion 28, or outside the first wall portion 28.

To reduce a change in refractive index of the ambient gas on the measurement optical paths of the laser interferometers due to the gas supplied from the second supply nozzle 11, the second supply nozzle 11 may supply a gas controlled to have the same composition, temperature, and humidity as those of the conditioned gas 24 blown from the conditioner 23. Assume that the second supply nozzle 11 supplies the gas controlled to have the same composition, temperature, and humidity as those of the conditioned gas 24 blown from the conditioner 23. Then, even if the gas supplied from the second supply nozzle 11 leaks out onto the measurement optical paths of the laser interferometers, the composition, temperature, and humidity of the ambient gas on the measurement optical paths of the laser interferometers remain the same, because the gas having leaked out has the same composition, temperature, and humidity as those of the ambient gas on the measurement optical paths of the laser interferometers. This makes it possible to prevent a change in refractive index of the ambient gas on the measurement optical paths of the laser interferometers.

Assume that the exposure apparatus shown in FIG. 4 controls the flow rates Q3 and Q4 to satisfy Q3<Q4, the second recovery nozzle 25 can completely recover the gas supplied from the second supply nozzle 11, and, therefore, the refractive index of the ambient gas on the measurement optical paths of the laser interferometers remains the same. In this case, the second supply nozzle 11 need not always supply the gas controlled to have the same composition, temperature, and humidity as those of the conditioned gas 24. For example, the gas supplied from the second supply nozzle 11 may be an inert gas, such as nitrogen.

Assume again that the second supply nozzle 11 supplies the gas controlled to have the same composition, temperature, and humidity as those of the conditioned gas 24 blown from the conditioner 23. Even in this case, the vapor of the liquid 22 flows from the first recovery nozzle 10 to the second supply nozzle 11 due to molecular diffusion. Consequently, the humidity of the gas supplied from the second supply nozzle 11 rises. This may change the humidity of the ambient gas on the measurement optical paths of the laser interferometers, resulting in a change in refractive index of the ambient gas. If such a change has occurred, the exposure apparatus may measure an increase in humidity of the ambient gas on the measurement optical paths of the laser interferometers due to the vapor of the liquid 22, thereby decreasing the humidity of the gas supplied from the second supply nozzle 11 by the increment (e.g., 1%). This makes it possible to reduce a change in refractive index of the ambient gas on the measurement optical paths of the laser interferometers.

Alternatively, a humidity sensor may be disposed near the measurement optical path of the X-direction laser interferometer 19 or Y-direction laser interferometer 21. On the basis of the result of measurement by the humidity sensor, a controller (not shown), built in the gas supply device 17, may control the humidity of the gas supplied from the second supply nozzle 11, so that the humidity of the ambient gas around the measurement optical path of the X-direction laser interferometer 19 or Y-direction laser interferometer 21 takes a predetermined value. This makes it possible to always maintain the humidity of the ambient gas on the measurement optical path of the X-direction laser interferometer 19 or Y-direction laser interferometer 21 constant, so as to more surely prevent the vapor of the liquid 22 from influencing the ambient gas on the measurement optical path of the laser interferometer.

The shape of the first supply nozzle 9, first recovery nozzle 10, second supply nozzle 11, or second recovery nozzle 25 used in the exposure apparatuses shown in FIGS. 1 to 4 will be explained next.

Figure 5A:
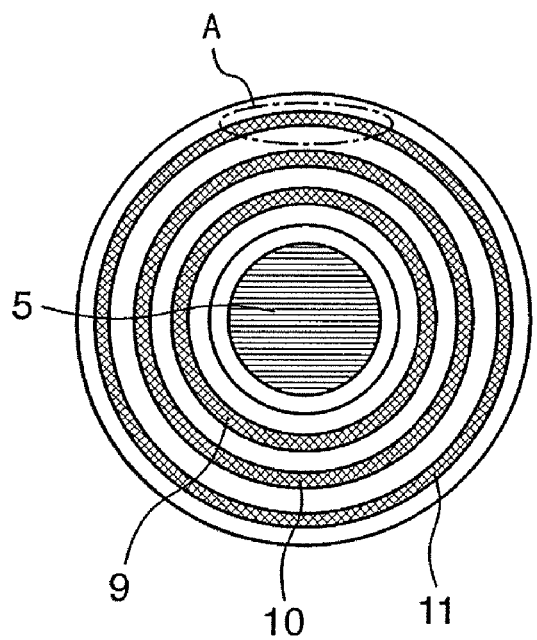
FIGS. 5A to 5C are views showing the shape of a first supply nozzle, a first recovery nozzle, a second supply nozzle, or a second recovery nozzle used in the projection exposure apparatus according to the first embodiment of the present invention.
Figure 5B:
Figure 5C:
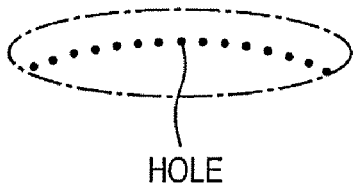

FIG. 5A is a plan view showing the structures of only the optical element 5, first supply nozzle 9, first recovery nozzle 10, and second supply nozzle 11 in the exposure apparatus shown in FIGS. 1 and 2. FIGS. 5B and 5C are views showing an example of the shape of the second supply nozzle 11, while enlarging a portion A shown in FIG. 5A.

To minimize a spatial variation in supply flow rate, forming a plurality of arrays of small holes on the circumference of the second supply nozzle 11, as shown in FIG. 5B, is desirable. Alternatively, small holes may align on the circumference of the second supply nozzle 11, as shown in FIG. 5C. The second supply nozzle 11 may use a porous material, such as a sintered material, foam material, or fibrous material made of a metal, resin, or inorganic substance used for a filter. Alternatively, the second supply nozzle 11 may be a slit nozzle which blows out a gas from a very small gap.

Although FIGS. 5A to 5C show the shape of the second supply nozzle 11, the first supply nozzle 9, first recovery nozzle 10, or second recovery nozzle 25 may similarly be a porous body, a slit nozzle, or the nozzle shown in FIG. 5B or 5C, so as to minimize a spatial variation in flow rate of the liquid or gas to be supplied or recovered. The same applies to the shape of a first supply nozzle 9, first recovery nozzle 10, second supply nozzle 11, or second recovery nozzle 25 according to each of the second to fourth embodiments to be described later.

The exposure apparatuses shown in FIGS. 1 to 4 have the first supply nozzle 9, first recovery nozzle 10, second supply nozzle 11, and second recovery nozzle 25, which are formed from a circular member. However, the shape of each nozzle is not limited to this. For example, a rectangular member can produce an effect similar to that of this embodiment.

In this embodiment, the first supply nozzle 9 surrounds the space between the optical element 5 and the wafer 6. In the process of filling the space between the optical element 5 and the wafer 6 with the liquid 22, supply of the liquid 22 from the whole area of the first supply nozzle 9 may, therefore, produce bubbles in that space. To cope with this problem, by dividing the first supply nozzle 9 (e.g., in four) into nozzles each having a liquid supply device or a valve to be open/close controlled, one of the divided nozzles may supply the liquid 22 to the space between the optical element 5 and the wafer 6 so as to fill that space with the liquid 22.

Alternatively, dividing the first recovery nozzle 10 here may provide the ability to separately control the divided nozzles to recover the liquid 22. This makes it possible to smoothly fill, with the liquid 22, the space between the optical element 5 and the wafer 6. Besides the first supply nozzle 9 or first recovery nozzle 10, a nozzle to fill, with the liquid 22, the space between the optical element 5 and the wafer 6, is available. Obviously, the flow controller 1000 may execute the flow control according to this embodiment after filling the space between the optical element 5 and the wafer 6 with the liquid 22.

Second Embodiment

An exposure apparatus according to the second embodiment of the present invention will be explained next with reference to FIG. 6.

Figure 6:
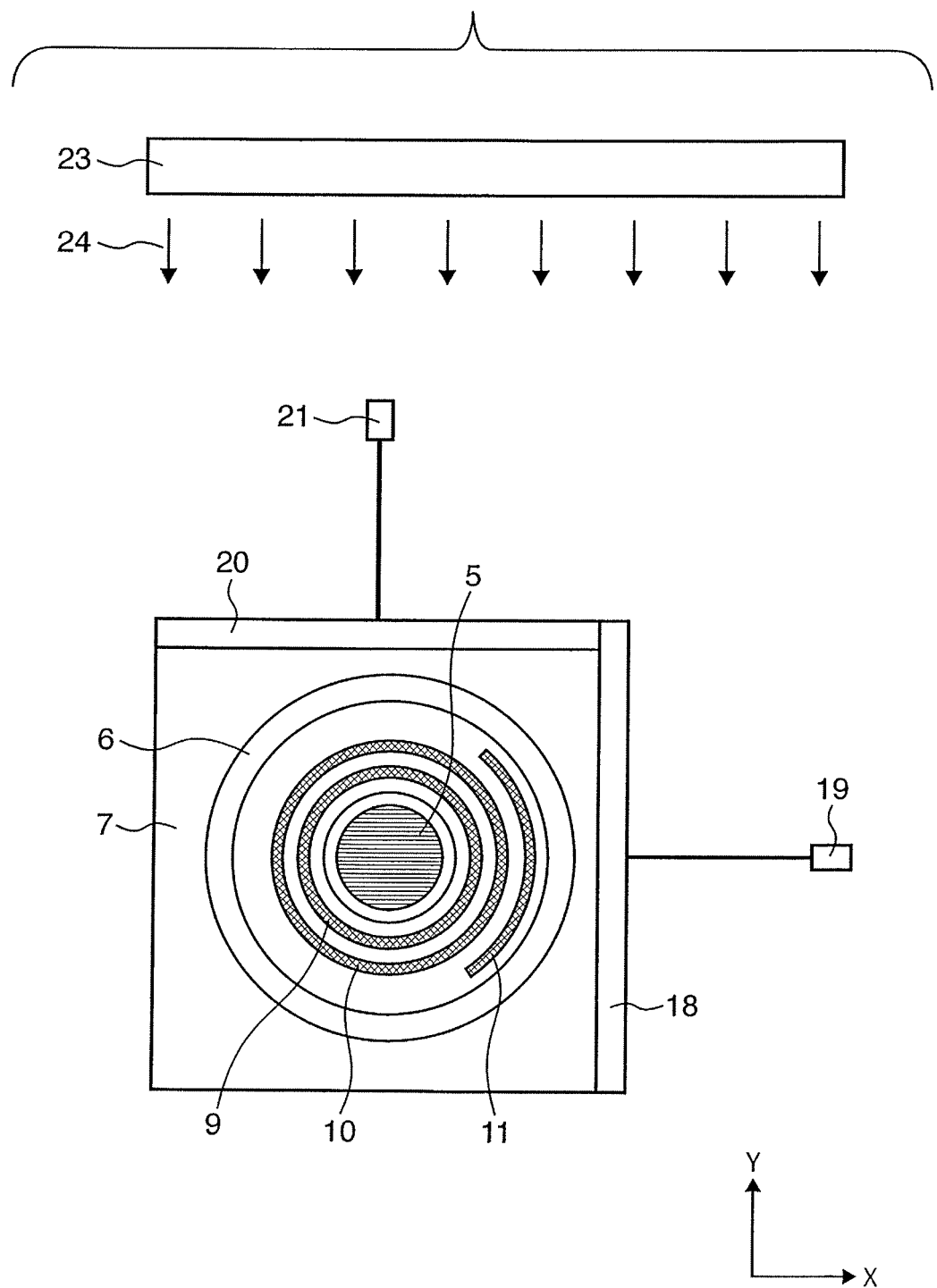
FIG. 6 is a plan view showing the schematic structure of a projection exposure apparatus near a wafer stage according to the second embodiment of the present invention.

FIG. 6 is a plan view showing the schematic structure of the exposure apparatus according to the second embodiment near a wafer stage 7, when cut away on the upper side from an optical element 5. The same reference numerals as those in the first embodiment denote the same constituent components of the exposure apparatus in FIG. 6, and a detailed description thereof will be omitted. The exposure apparatus according to this embodiment is different from that shown in FIGS. 1 and 2 in that a second supply nozzle 11 is arranged only near an X-direction measurement mirror 18.

The exposure apparatus shown in FIG. 6 can prevent a change in refractive index of an ambient gas on the measurement optical path of a Y-direction laser interferometer 21 by utilizing the flow of a conditioned gas 24 blown from a conditioner 23. Therefore, the second supply nozzle 11 is arranged only near the X-direction measurement mirror 18, so as to prevent the vapor produced from a liquid from influencing the ambient gas on the measurement optical path of an X-direction laser interferometer 19.

As described above, when the flow of the conditioned gas 24 exists around the wafer stage 7, the use of that flow provides the ability to prevent a change in refractive index of the ambient gas on the measurement optical paths of the X-direction laser interferometer 19 and Y-direction laser interferometer 21, by simply arranging the second supply nozzle 11 only near the X-direction measurement mirror 18.

Obviously, the exposure apparatus designed to arrange the second supply nozzle 11 only near the X-direction measurement mirror 18, as shown in FIG. 6, is applicable to the exposure apparatuses shown in FIGS. 3 and 4, according to the modifications to the first embodiment. To apply this structure to the exposure apparatus shown in FIG. 4, the positional relationship between the conditioner 23 and the second supply nozzle 11 of the exposure apparatus shown in FIG. 6 may be applied to a second recovery nozzle 25. As a matter of course, that positional relationship may be applied to both the second supply nozzle 11 and second recovery nozzle 25.

Third Embodiment

An exposure apparatus according to the third embodiment of the present invention will be explained next with reference to FIG. 7.

Figure 7:
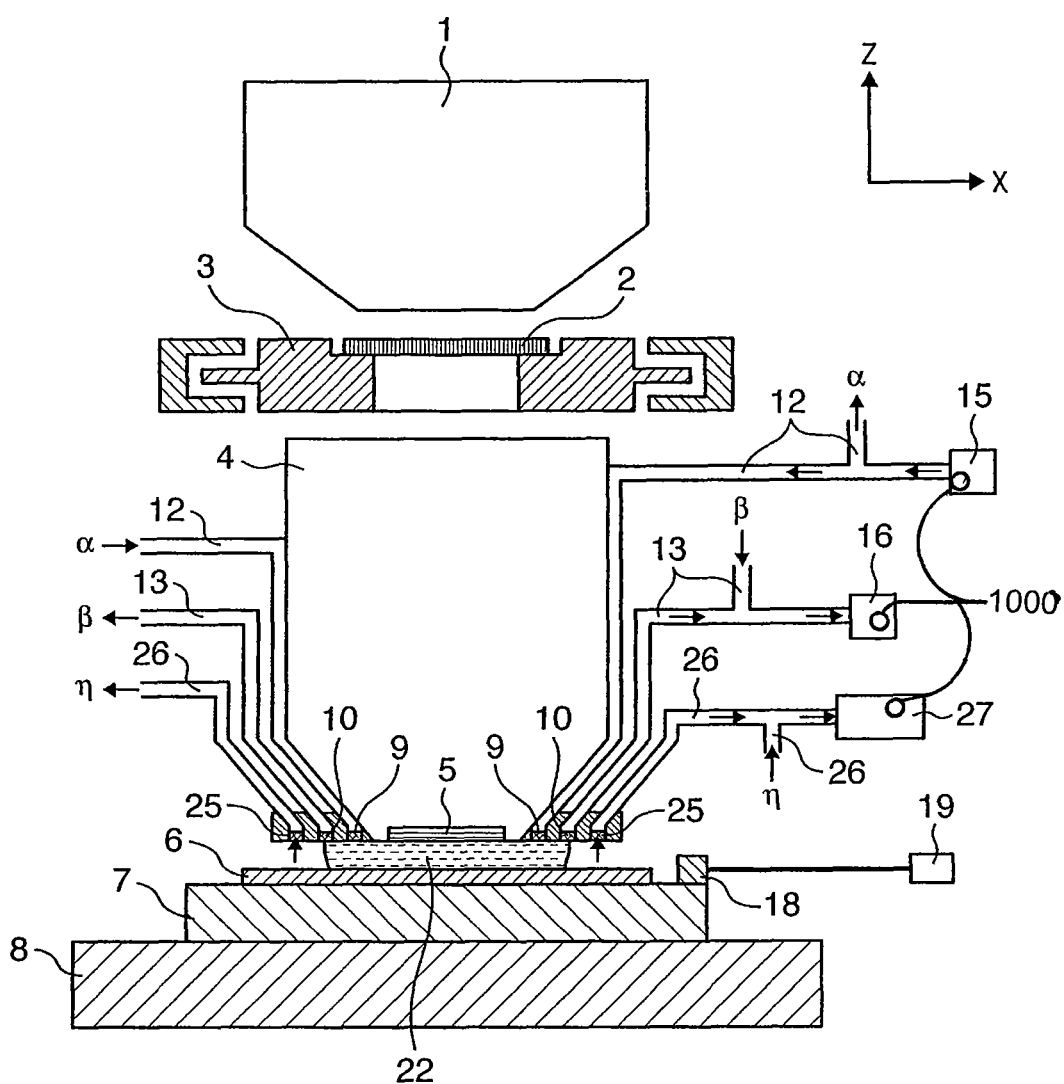
FIG. 7 is a side view showing the schematic structure of a projection exposure apparatus according to a third embodiment of the present invention.

FIG. 7 is a schematic side view of the exposure apparatus according to the third embodiment. The same reference numerals as those in the first and second embodiments denote the same constituent components of the exposure apparatus in FIG. 7, and a detailed description thereof will be omitted. The exposure apparatus according to this embodiment is different from that shown in FIGS. 1 and 2 in having a second recovery nozzle 25 in place of a second supply nozzle 11.

The exposure apparatus according to this embodiment allows the second recovery nozzle 25 to surround a first recovery nozzle 10. These recovery nozzles provide the ability to more surely recover the vapor produced from a liquid 22. This makes it possible to reduce the influence of the vapor of the liquid 22 on an ambient gas on the measurement optical path of a laser interferometer.

Desirably, a first wall portion similar to that of the exposure apparatus shown in FIG. 3, according to the modification to the first embodiment, surrounds the second recovery nozzle 25 from its outside, in order to more effectively form a current of a gas from the vicinity of a wafer stage 7 to the second recovery nozzle 25, so as to further reduce the influence of the vapor of the liquid 22 on the measurement optical path of the laser interferometer.

Figure 8:
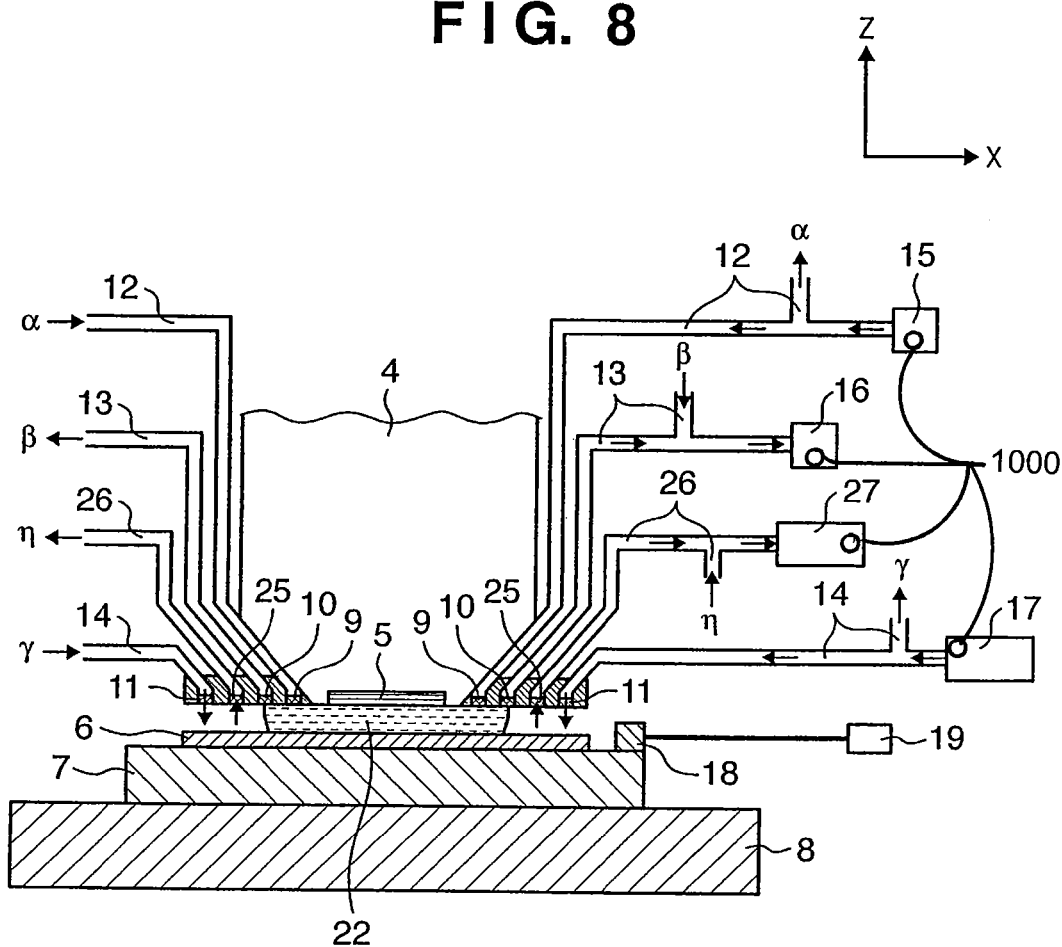
FIG. 8 is a side view showing the schematic structure of a projection exposure apparatus near a wafer stage according to a modification to the third embodiment of the present invention.

Alternatively, to form a current of the gas toward the second recovery nozzle 25, the second supply nozzle 11 may surround the second recovery nozzle 25, as shown in FIG. 8. FIG. 8 is a side view showing the schematic structure of an exposure apparatus near the wafer stage 7 according to a modification to this embodiment. The same reference numerals as those in FIGS. 1 to 7 denote the same constituent components of the exposure apparatus in FIG. 8. The exposure apparatus shown in FIG. 8 is different from that shown in FIG. 7, in that the second supply nozzle 11 surrounds the second recovery nozzle 25, in addition to the structure of the exposure apparatus shown in FIG. 7.

The exposure apparatus shown in FIG. 8 provides the ability to more surely form a current of a gas from the second supply nozzle 11 to the second recovery nozzle 25 by supplying the gas from the second supply nozzle 11. This current faces and serves as a resistance against the vapor of the liquid 22. This makes it possible to more surely prevent the vapor of the liquid 22 from influencing the ambient gas on the measurement optical path of the laser interferometer.

When the exposure apparatus shown in FIG. 7 has the first wall portion, the second supply nozzle 11 may be inserted between the second recovery nozzle 25 and the first wall portion or outside the first wall portion.

When a change in refractive index of the ambient gas on the measurement optical path of the laser interferometer has occurred due to the gas supplied from the second supply nozzle 11, the second supply nozzle 11 may supply a gas controlled to have the same composition, temperature, and humidity as those of a conditioned gas 24 blown from a conditioner 23. Alternatively, a recovery nozzle to recover the gas may newly surround the second supply nozzle 11 from its further outside.

The exposure apparatus shown in FIG. 7 may be designed to arrange the second recovery nozzle 25 only near an X-direction measurement mirror 18. Similar to the exposure apparatus according to the second embodiment, the exposure apparatus shown in FIG. 7 forms a current of the conditioned gas 24 around the wafer stage 7. The use of the current of the conditioned gas 24 provides the ability to prevent a change in refractive index of the ambient gas on the measurement optical path of a Y-direction measurement mirror 20. Therefore, the second recovery nozzle 25 may be arranged only near the X-direction measurement mirror 18, so as to prevent the vapor of the liquid 22 from influencing the ambient gas on the measurement optical path of an X-direction laser interferometer 19.

Obviously, the exposure apparatus designed to arrange the second supply nozzle 25 only near the X-direction measurement mirror 18, as described above, is applicable to the exposure apparatus shown in FIG. 8. To apply this structure to the exposure apparatus shown in FIG. 8, the second supply nozzle 11 may be arranged only near the X-direction measurement mirror 18. As a matter of course, both the second recovery nozzle 25 and second supply nozzle 11 may be disposed only near the X-direction measurement mirror 18.

Fourth Embodiment

An exposure apparatus according to the fourth embodiment of the present invention will be explained next with reference to FIG. 9.

Figure 9:
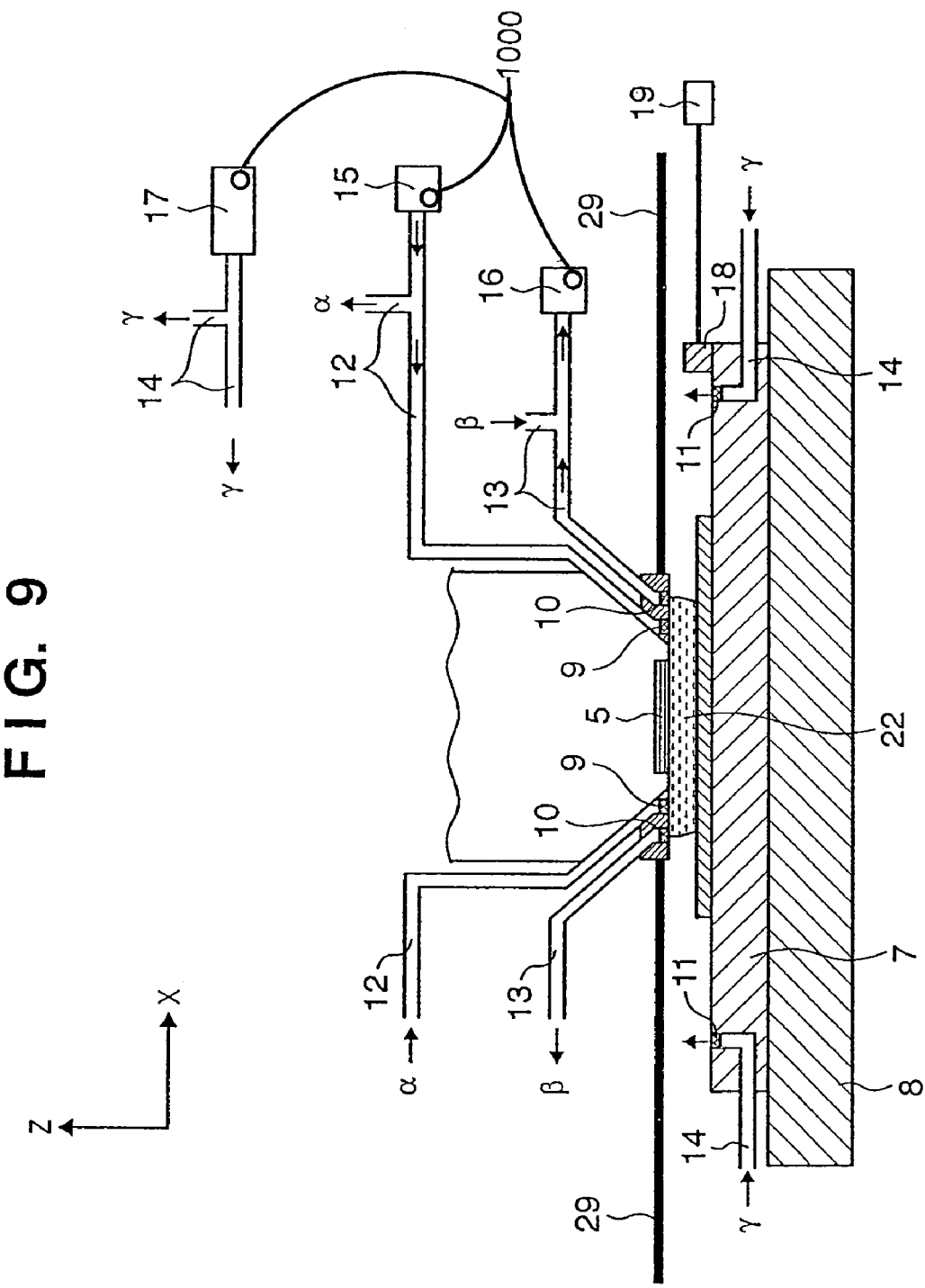
FIG. 9 is a side view showing the schematic structure of a projection exposure apparatus near a wafer stage according to a fourth embodiment of the present invention.

FIG. 9 is a side view showing the schematic structure of the exposure apparatus near a wafer stage 7 according to the fourth embodiment. The same reference numerals as those in the first to third embodiments denote the same constituent components of the exposure apparatus in FIG. 9, and a detailed description thereof will be omitted. The exposure apparatus according to this embodiment is different from that shown in FIGS. 1 and 2, in that the wafer stage 7 has a second supply nozzle 11 and a second wall portion 29 is formed throughout the entire circumference of a projection optical system 4.

Figure 10:
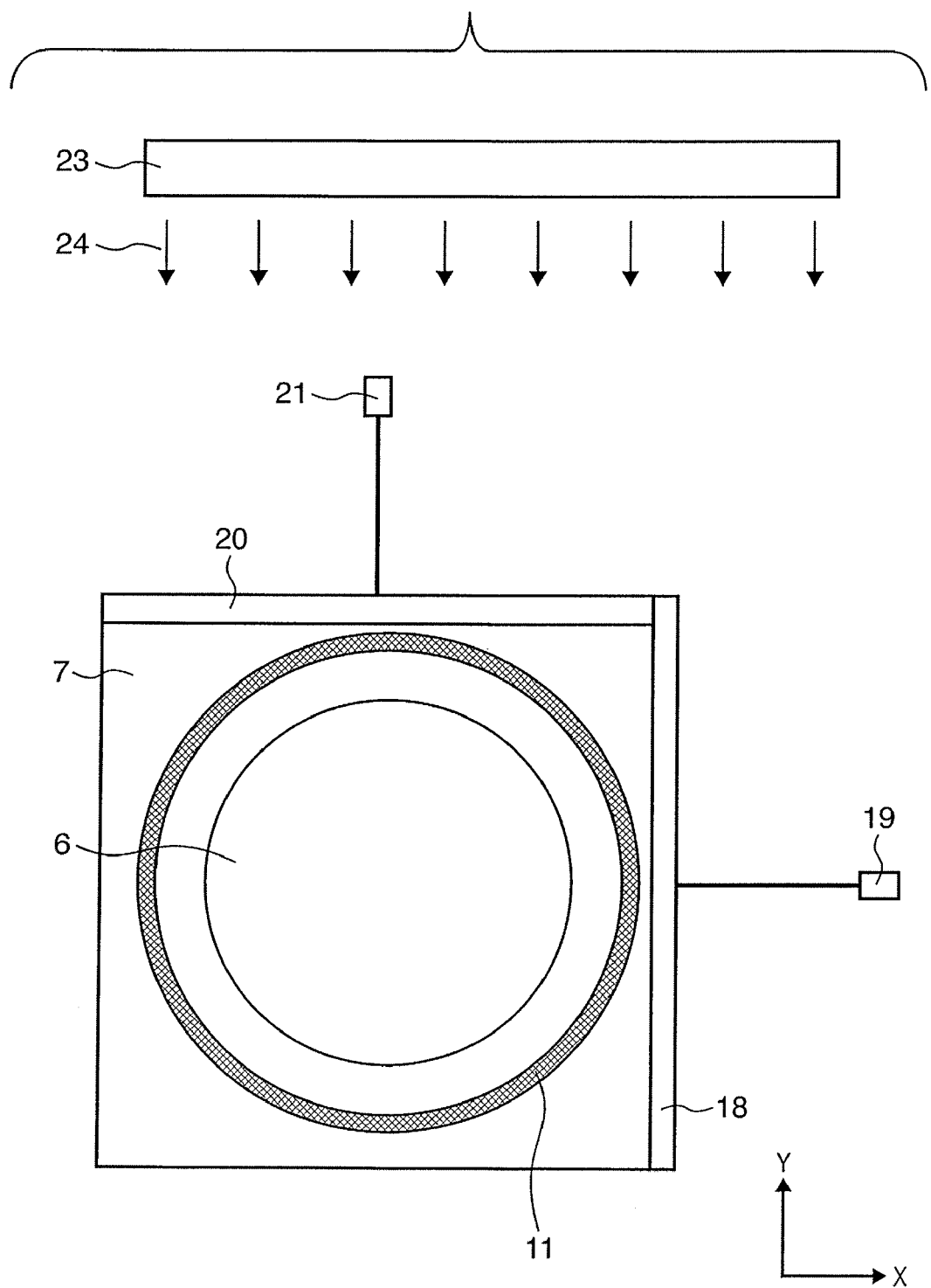
FIG. 10 is a plan view showing the schematic structure of the projection exposure apparatus near the wafer stage according to the fourth embodiment of the present invention.

The exposure apparatus according to this embodiment allows the second supply nozzle 11 to surround a wafer 6 on the wafer stage 7, as shown in FIG. 10. FIG. 10 is a plan view of the exposure apparatus shown in FIG. 9 when cut away on the upper side from the wafer 6. The second wall portion 29 is almost parallel to the wafer 6 throughout the entire circumference of the projection optical system 4. It is possible to form the second wall portion 29 by shaping a material such as a metal, resin, or ceramics into a disk.

A gas supplied from the second supply nozzle 11 forms a gas curtain. The gas curtain and the second wall portion 29 can partition the space around the wafer stage 7 and the space (humid gas space) containing the vapor produced from a liquid 22. This makes it possible to reduce the influence of the vapor of the liquid 22 on an ambient gas on the measurement optical path of a laser interferometer. Note that the second wall portion 29 is large enough to allow the gas supplied from the second supply nozzle 11 to form the gas curtain even during exposure for the vicinity of the edge of the wafer 6.

Figure 11A:
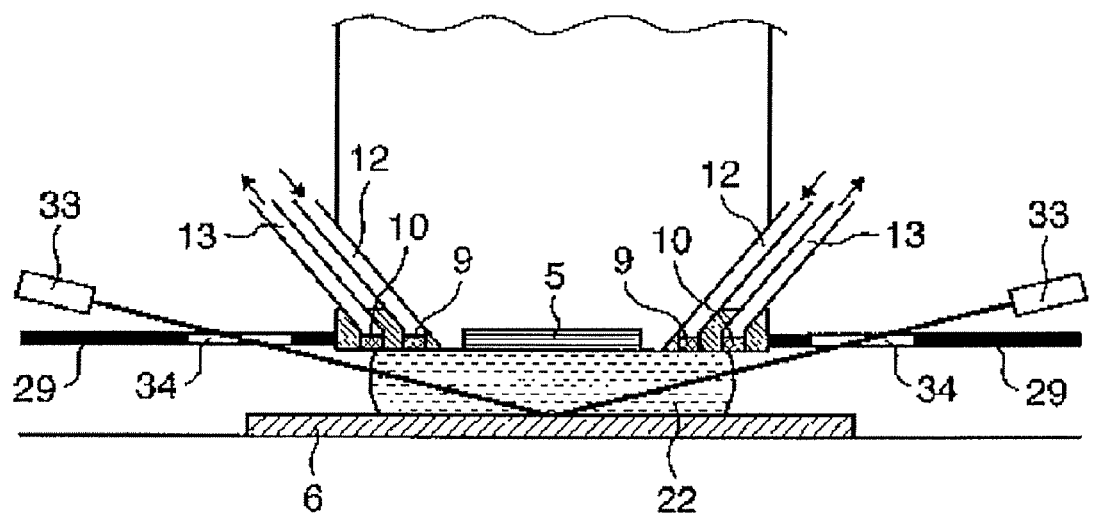
FIGS. 11A and 11B are side views showing the schematic structure of the projection exposure apparatus near a wafer according to the fourth embodiment of the present invention.

Disposing, near the projection optical system 4, an alignment measurement implement, which detects the position of the wafer 6 or a light focus sensor for detecting the position of the exposure surface of the wafer 6 with respect to the focus position of a projection optical implement sometimes makes the second wall portion 29 shield measurement light of the alignment measurement implement or measurement light of the light focus sensor. In this case, as shown in FIG. 11A, part of the second wall portion 29, through which measurement light passes, may use glass to transmit measurement light. FIG. 11A is a schematic view showing the structure of the exposure apparatus shown in FIGS. 9 and 10 near the wafer 6 when the second wall portion 29 partially uses a glass 34 to transmit measurement light from a light focus sensor 33. The same reference numerals as in FIGS. 9 and 10 denote the same constituent components of the exposure apparatus in FIG. 11A. FIG. 11A shows only the structure in which the measurement light of the light focus sensor 33 passes. Obviously, however, part of the second wall portion 29, through which measurement light passes, may also use glass to transmit measurement light from the alignment measurement implement.

The exposure apparatus according to this embodiment is designed to make the second supply nozzle 11 surround the wafer 6 and to form the second wall portion 29 throughout the entire circumference of the projection optical system 4. However, the second supply nozzle 11 and second wall portion 29 may be arranged only near an X-direction measurement mirror 18. Even the exposure apparatus according to this embodiment forms a current of a conditioned gas 24 around the wafer stage 7. The use of the current of the conditioned gas 24 provides the ability to prevent a change in refractive index of the ambient gas on the measurement optical path of a Y-direction measurement mirror 20. Therefore, the second supply nozzle 11 and second wall portion 29 may be arranged only near the X-direction measurement mirror 18, so as to prevent the vapor produced from the liquid 22 from influencing the ambient gas on the measurement optical path of an X-direction laser interferometer 19.

The exposure apparatus according to this embodiment is designed such that the wafer stage 7 has the second supply nozzle 11. A second recovery nozzle may be substituted for the second supply nozzle 11. When the second recovery nozzle recovers the vapor of the liquid 22, it is possible to prevent a change in refractive index of the ambient gas on the measurement optical paths of the X-direction laser interferometer 19 and a Y-direction laser interferometer 21. This makes it possible to obtain an effect similar to that of this embodiment.

Figure 11B:
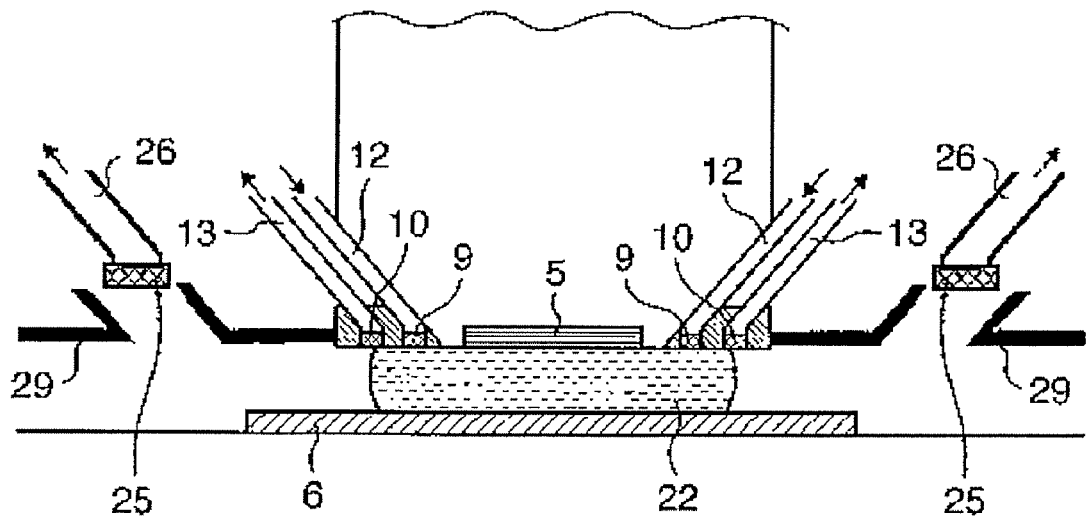

The exposure apparatus according to this embodiment is designed such that the second supply nozzle 11 or the second recovery nozzle is arranged in the stage. The second supply nozzle 11 or the second recovery nozzle may be arranged in the second wall portion 29. FIG. 11B is a schematic side view of the exposure apparatus when the second recovery nozzle 25 is arranged in the second wall portion 29. The second recovery nozzle 25 surrounds the periphery of the first recovery nozzle 10 and recovers the vapor of the liquid 22. The second recovery nozzle 25 and the second wall portion 29 can partition the space around the wafer stage 7 and the space (humid gas space) containing the vapor produced from a liquid 22. This makes it possible to reduce the influence that the vapor of the liquid 22 exerts on an ambience of the measurement optical path of a laser interferometer.

Effects of the Above Embodiments

Effects achievable by the exposure apparatus according to each of the above embodiments will be explained below.

(Mode 1)

In the first embodiment, the first supply nozzle 9 to supply the liquid 22 surrounds the optical element 5 at the end face of the projection optical system. The first recovery nozzle 10 to recover a liquid and gas surrounds the first supply nozzle 9. The second supply nozzle 11 to supply a gas surrounds the first recovery nozzle 10. Let Q1 be the flow rate of the liquid supplied from the first supply nozzle 9, and Q2 be the sum total of the flow rates of the liquid and gas recovered from the first recovery nozzle 10. The controllers control the flow rates Q1 and Q2 to satisfy Q1<Q2.

Effects of Mode 1 will be explained here with reference to FIGS. 12 and 13.

Figure 12:
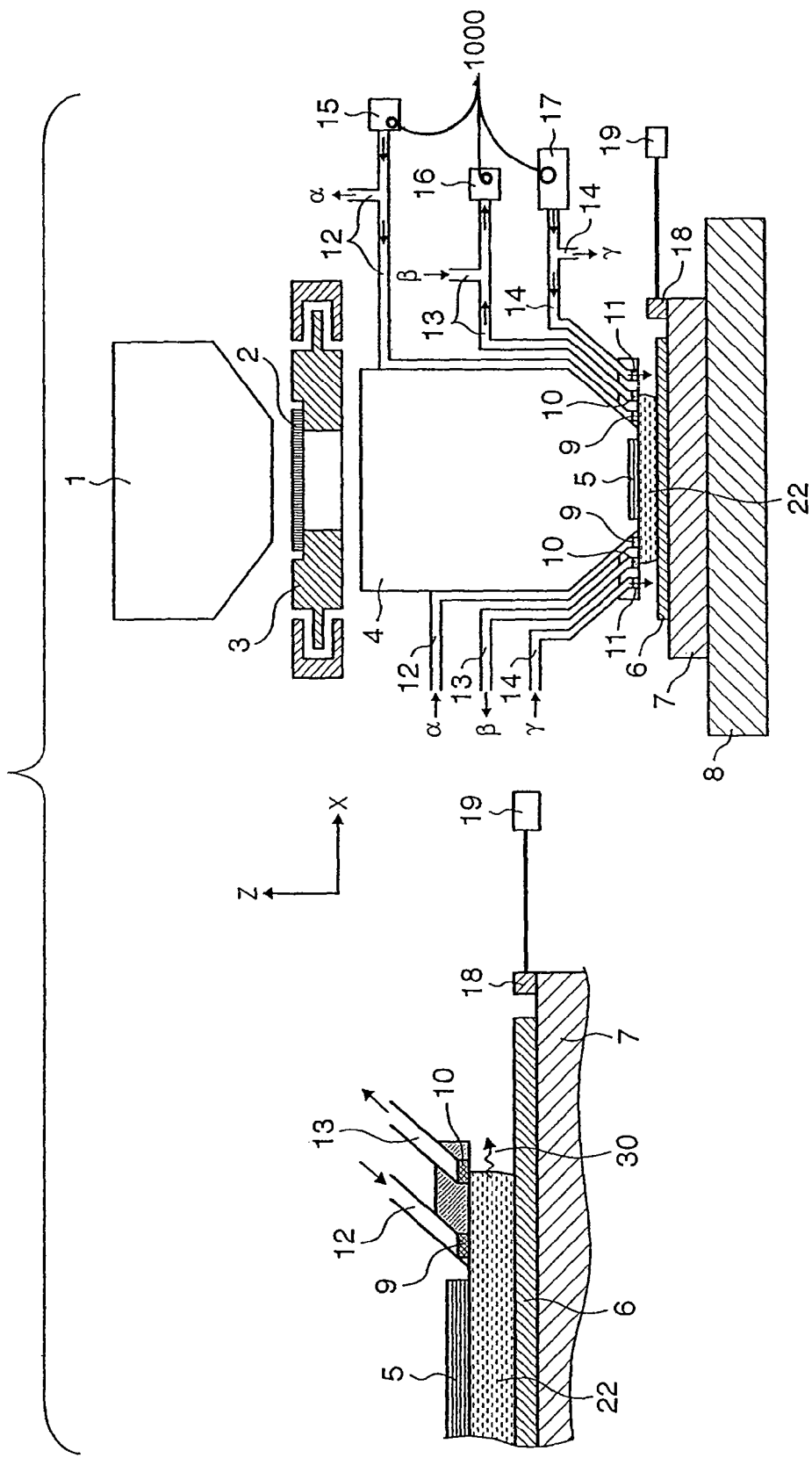
FIG. 12 is a schematic view showing a current of a vapor around the wafer.
Figure 13:
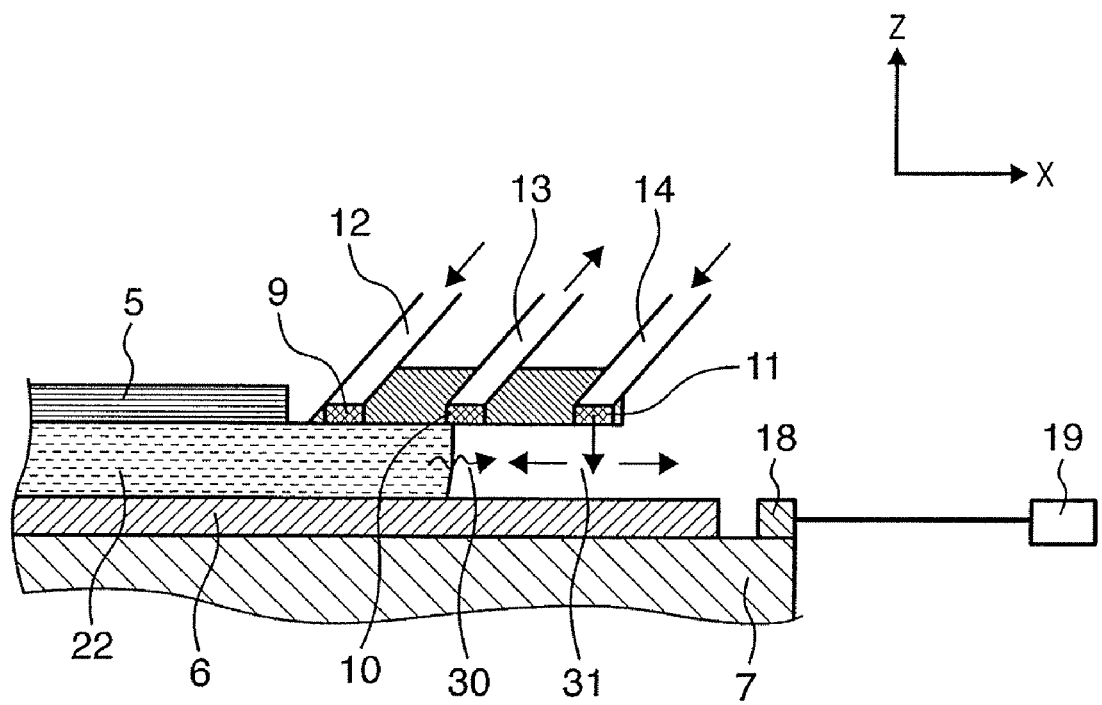
FIG. 13 is a schematic view showing currents of a vapor and a gas around the wafer.

FIGS. 12 and 13 are enlarged views of the vicinity of the first supply nozzle 9 to supply a liquid, the first recovery nozzle 10 to recover a liquid and gas, and the X-direction laser interferometer 19. FIG. 12 is a schematic view showing a current 30 of the vapor produced from the liquid 22 when the exposure apparatus does not have the second supply nozzle 11 to supply a gas. FIG. 13 is a schematic view showing a current 30 of the vapor produced from the liquid 22 and a current 31 of the gas supplied from the second supply nozzle 11 when the exposure apparatus has the second supply nozzle 11 to supply a gas.

As shown in FIG. 12, when the exposure apparatus does not have the second supply nozzle 11, the vapor of the liquid 22 leaks out to the periphery of the wafer stage 7. Consequently, the refractive index of the ambient gas on the measurement optical path of the X-direction laser interferometer 19 changes. Especially, when the wafer stage 7 operates by the step and scan scheme, the liquid 22 migrates upon being drawn by the wafer 6 due to the viscosity effect. Consequently, the density of the vapor of the liquid 22 has a steep distribution around the wafer stage 7. This further greatly changes the refractive index of the ambient gas on the measurement optical path of the X-direction laser interferometer 19. Although FIG. 12 shows the X-direction laser interferometer 19, the same applies to the Y-direction laser interferometer 21.

On the other hand, as shown in FIG. 13, when the second supply nozzle 11 to supply a gas surrounds the first recovery nozzle 10 from its outside, the gas supplied from the second supply nozzle 11 forms a gas curtain. This makes it possible to partition the space around the wafer stage 7 and the space (humid gas space) containing the vapor produced from the liquid 22 so as to reduce the influence of the vapor of the liquid 22 on the ambient gas on the measurement optical path of the laser interferometers. Setting Q1<Q2 allows the first recovery nozzle 10 to partially or completely recover the gas, which forms the gas curtain, so as to surely form the current 31 of the gas from the second supply nozzle 11 to the first recovery nozzle 10. This current faces and serves as a resistance against the vapor produced from the liquid 22. This allows the wafer stage 7 to separate from the space (humid gas space) containing the vapor of the liquid 22, even when the wafer stage 7 operates by the step and scan scheme. This makes it possible to reduce or to prevent the influence of the vapor of the liquid 22 on the ambient gas on the measurement optical path of the laser interferometers.

(Mode 2)

In the first modification to the first embodiment, the first wall portion 28, which extends from the lower end of the projection optical system toward the substrate, surrounds the second supply nozzle 11, according to mode 1 from its outside.

Since the first wall portion 28 serves as a resistance against the current of the gas, it is possible to increase the pressure of the gas supplied from the second supply nozzle 11. This makes it possible to positively form a current of a gas from the second supply nozzle 11 to the first recovery nozzle 10. It is, therefore, possible to more surely prevent the vapor of the liquid from leaking out to the periphery of the stage and to further reduce or more surely prevent the influence of the vapor of the liquid on the ambient gas on the measurement optical path of the laser interferometer. The first wall portion also achieves an effect of preventing a droplet, which has splashed from the liquid, from adhering to the periphery of the substrate or stage.

(Mode 3)

In the second modification to the first embodiment, the second recovery nozzle 25 to recover a gas surrounds the second supply nozzle 11 according to mode 1 from its outside.

When the second recovery nozzle 25 to recover a gas surrounds the second supply nozzle 11, it can recover the gas supplied from the second supply nozzle 11. It is, therefore, possible to reduce a change in refractive index, which arises when the gas supplied from the second supply nozzle 11 leaks out onto the measurement optical path of the laser interferometer, and the composition of the ambient gas on the measurement optical path changes.

(Mode 4)

In another example of the first embodiment, the second recovery nozzle 25 to recover a gas is arranged between the first wall portion 28 and the second supply nozzle 11 according to mode 2 or outside the first wall portion 28, so as to surround the second supply nozzle 11.

Assume that the exposure apparatus according to mode 2 is designed to arrange the second recovery nozzle 25 to recover the gas supplied from the second supply nozzle 11. The second recovery nozzle 25 can recover the gas supplied from the second supply nozzle 11, so as to reduce a change in refractive index of the ambient gas on the measurement optical path of the laser interferometer, irrespective of whether it is interposed between the second supply nozzle 11 and the first wall portion 28 or outside the first wall portion 28.

(Mode 5)

In still another example of the first embodiment, let Q3 be the flow rate of the gas supplied from the second supply nozzle 11 according to mode 3 or 4, and Q4 be the flow rate of the gas recovered from the second recovery nozzle 25 according to mode 3 or 4. The exposure apparatus controls the flow rates Q3 and Q4 to satisfy Q3<Q4.

Setting Q3<Q4 allows the second recovery nozzle 25 to almost completely recover the gas supplied from the second supply nozzle 11. Therefore, the gas supplied from the second supply nozzle 11 never leaks out onto the measurement optical paths of the laser interferometer. It is, therefore, possible to prevent a change in refractive index of the ambient gas on the measurement optical path of the laser interferometer.

Modes 1 to 5 have described the structure in which the second supply nozzle 11 to supply a gas surrounds the first recovery nozzle 10 to recover a liquid and gas.

Modes 6 to 9 hereinafter will describe the structure in which the second recovery nozzle 25 to recover a gas is substituted for the second supply nozzle 11.

(Mode 6)

In the third embodiment, the first supply nozzle 9 to supply a liquid surrounds the optical element 5 at the end face of the projection optical system. The first recovery nozzle 10 to recover a liquid and gas surrounds the first supply nozzle 9. The second recovery nozzle 25 to recover a gas surrounds the first recovery nozzle 10. Let Q1 be the flow rate of the liquid supplied from the first supply nozzle 9, and Q2 be the sum total of the flow rates of the liquid and gas recovered from the first recovery nozzle 10. The controllers control the flow rates Q2 and Q1 to satisfy Q1<Q2.

Effects of mode 6 will be explained here with reference to FIG. 14.

FIG. 14 is an enlarged view of the vicinity of the first supply nozzle 9 to supply a liquid, the first recovery nozzle 10 to recover a liquid and gas, the second recovery nozzle 25 to recover a gas, and the X-direction laser interferometer 19. FIG. 14 is a schematic view showing a current 30 of the vapor of the liquid 22 and a current 32 of the gas around the second recovery nozzle 25.

As shown in FIG. 14, when the second recovery nozzle 25 surrounds the first recovery nozzle 10, the second recovery nozzle 25 can recover the vapor produced from the liquid 22. It is, therefore, possible to reduce or to prevent a change in refractive index of the ambient gas on the measurement optical path of the laser interferometer, which arises when the vapor produced from the liquid 22 leaks out to the periphery of the wafer stage 7. Furthermore, the current 32 of the gas from the periphery of the wafer stage 7 to the second recovery nozzle 25 is formed around the second recovery nozzle 25. This gas current 32 faces and serves as a resistance against the current 30 of the vapor of the liquid 22. The gas current 32 also achieves an effect of preventing or suppressing the vapor of the liquid 22 from leaking out to the periphery of the wafer stage 7.

Setting Q1<Q2 allows the first recovery nozzle 10 to completely recover the liquid 22. Therefore, the liquid 22 never spreads toward the second recovery nozzle 25 beyond the first recovery nozzle 10. It is, therefore, possible to limit the generation source of the vapor of the liquid 22 to the vicinity of the first recovery nozzle 10. The second recovery nozzle 25 can surely recover the vapor of the liquid 22.

(Mode 7)

In the modification to the third embodiment, the first wall portion 28, which extends from the lower end of the projection optical system toward the substrate, surrounds the second recovery nozzle 25, according to mode 6, from its outside.

The first wall portion serves as a resistance against the gas current and makes the flow of the gas from the periphery of the wafer stage to the second recovery nozzle uniform. It is, therefore, possible to form a current of the gas from the periphery of the stage to the second recovery nozzle, irrespective of the flow of the gas around the stage or movement of the stage. This makes it possible to more surely prevent the vapor of the liquid from leaking out to the periphery of the stage. It is, therefore, possible to further reduce or more surely to prevent the influence of the vapor of the liquid on the ambient gas on the measurement optical path of the laser interferometer. The first wall portion also achieves an effect of preventing a droplet, which has splashed from the liquid, from adhering to the periphery of the substrate or stage.

(Mode 8)

In another example of the third embodiment, the second supply nozzle 11 to supply a gas surrounds the second recovery nozzle 25, according to mode 6, from its outside.

As described above, arranging, outside the second recovery nozzle 25, the second supply nozzle 11 to supply a gas makes it possible to more surely form a current of the gas from the second supply nozzle 11 to the second recovery nozzle 25. This current faces and serves as a resistance against the vapor produced from the liquid. It is, therefore, possible to further reduce or more surely to prevent the influence of the vapor of the liquid on the ambient gas on the measurement optical path of the laser interferometer.

(Mode 9)

In still another example of the third embodiment, the exposure apparatus according to mode 7 is designed to arrange the second supply nozzle 11, to supply a gas, between the second recovery nozzle 25 and the first wall portion 28, or outside the first wall portion 28, so as to surround the second recovery nozzle 25.

Assume that the exposure apparatus according to mode 7 has the second supply nozzle 11 to supply a gas. The second recovery nozzle 11 can form a current of the gas from the second supply nozzle 11 to the second recovery nozzle 25, so as to further reduce or more surely to prevent the influence of the vapor of the liquid on the ambient gas on the measurement optical path of the laser interferometer, irrespective of whether it is interposed between the second recovery nozzle 25 and the first wall portion 28 or outside the first wall portion 28.

Modes 1 to 9 have described the structure in which the projection optical system has the second supply nozzle 11 to supply a gas or the second recovery nozzle 25 to recover a gas.

Modes 10 to 12 hereinafter will describe the structure in which the stage 7 to hold the wafer 6 has the second supply nozzle 11 or second recovery nozzle 25.

(Mode 10)

In the fourth embodiment, the first supply nozzle 9 to supply a liquid surrounds the end face of the projection optical system. The first recovery nozzle 10 to recover a liquid and gas surrounds the first supply nozzle 9. The second supply nozzle 11 to supply a gas is formed in the wafer stage 7 to hold the wafer 6 so as to surround the substrate. To limit the space containing the vapor of the liquid, the second wall portion 29, which is almost parallel to the substrate surface, is formed on the entire circumference of the projection optical system. This allows the second supply nozzle 11 to supply the gas to the second wall portion 29. Let Q1 be the flow rate of the liquid supplied from the second supply nozzle 11, and Q2 be the sum total of the flow rates of the liquid and gas recovered from the first recovery nozzle 10. The controllers control the flow rates Q1 and Q2 to satisfy Q1<Q2.

As described above, forming, on the entire circumference of the projection optical system, the second wall portion 29, which is almost parallel to the substrate surface, allows the gas supplied from the second supply nozzle 11 to form the gas curtain, so as to partition the space around the stage and the space (humid gas space) containing the vapor of the liquid. This makes it possible to reduce or to prevent the influence of the vapor of the liquid on the ambient gas on the measurement optical path of the laser interferometer.

(Mode 11)

In the modification to the fourth embodiment, the exposure apparatus according to mode 10 comprises an alignment measurement implement which detects the position of a substrate, and a focus position detection implement which detects the position of the exposure surface of the substrate with respect to the focus position of a projection optical implement. The second wall portion 29, through which measurement light of the alignment measurement implement and measurement light of the focus position detection implement pass, uses a member to transmit measurement light.

As described above, when the second wall portion 29, through which measurement light passes, uses a member to transmit measurement light, it is possible to prevent the second wall portion 29 from shielding or absorbing the measurement light, so as to detect the substrate position and focus position with high accuracy.

(Mode 12)

In another modification to the fourth embodiment, the exposure apparatuses according to modes 10 to 11 have the second recovery nozzle 25 to recover a gas in place of the second supply nozzle 11.

When the second recovery nozzle 25 to recover a gas is substituted for the second supply nozzle 11, it can recover the vapor of the liquid. This makes it possible to partition the space around the stage and the space (humid gas space) containing the vapor of the liquid. It is, therefore, possible to reduce or to prevent the influence of the vapor of the liquid on the ambient gas on the measurement optical path of the laser interferometer.

Modes 1 to 9 have described the structure in which the second supply nozzle or second recovery nozzle surrounds the first recovery nozzle. According to modes 10 to 12, the second supply nozzle or second recovery nozzle is arranged in the wafer stage and surrounds the substrate, and the second wall is arranged over the entire circumference of the projection optical system and faces the wafer stage.

Modes 13 and 14 hereinafter will describe the structure in which the second supply nozzle 11 or second recovery nozzle 25 is arranged in the second wall portion 29.

(Mode 13)

In another modification to the fourth embodiment, the exposure apparatuses according to modes 10 to 11 have the second supply nozzle 11 in the second wall portion 29. The second supply nozzle 11 surrounds the periphery of the first recovery nozzle 10 and supplies gas, so as to form a gas curtain for isolating liquid or vapor produced from the liquid.

The wafer 6 or wafer stage 7 allows the gas supplied from the second supply nozzle 11 to form the gas curtain, so as to partition the space around the stage and the space (humid gas space) containing the vapor of the liquid. This makes it possible to reduce or to prevent the influence that the vapor of the liquid exerts on the ambience of the measurement optical path of the laser interferometer.

(Mode 14)

In another modification to the fourth embodiment, the exposure apparatus according to mode 14 has, in place of the second supply nozzle 11, the second recovery nozzle 25 configured to recover gas.

The second recovery nozzle 25 surrounds the periphery of the first recovery nozzle 10 and recovers the vapor of the liquid 22. The second recovery nozzle 25 and the second wall portion 29 can partition the space around the wafer stage 7 and the space (humid gas space) containing the vapor produced from the liquid 22. This makes it possible to reduce the influence that the vapor of the liquid 22 exerts on an ambience of the measurement optical path of a laser interferometer.

Modes 1 to 9 described have the structure in which the second supply nozzle or second recovery nozzle surrounds the first recovery nozzle. According to modes 10 to 12, the second supply nozzle or second recovery nozzle is arranged in the wafer stage and surrounds the substrate, and the second wall 29 is arranged over the entire circumference of the projection optical system, and faces the wafer stage 7. According to modes 13 and 14, the second supply nozzle or second recovery nozzle is arranged in the second wall 29 and surrounds the first recovery nozzle.

Mode 15 hereinafter will describe the case in which the exposure apparatuses according to modes 1 to 14 comprise a conditioner, which blows a gas into the space including a stage, which holds a substrate. A second supply nozzle or second recovery nozzle and a second wall portion are arranged near a measurement mirror for a laser interferometer disposed on the stage.

(Mode 15)

According to a mode common to the above embodiments, an exposure apparatus comprises a stage, which holds a substrate drivable in the X direction and Y direction orthogonal to each other, and a laser interferometer, which measures the position along the X direction and Y direction. An X direction measurement mirror and a Y direction measurement mirror are disposed on the stage such that their reflection surfaces become perpendicular to the X-direction measurement optical path and Y-direction measurement optical path, respectively, of the laser interferometers. A conditioner, which blows a gas faces the reflection surface of the X-direction or Y-direction measurement mirror. At least one of a second supply nozzle, second recovery nozzle, and second wall portion is arranged near a measurement mirror, which does not face the conditioner.

Effects in the case in which the conditioner which blows a gas faces the reflection surface of the Y-direction measurement mirror, and the second supply nozzle is arranged near the X-direction measurement mirror, will be explained here, with reference to FIGS. 15 and 16.

Figure 15:
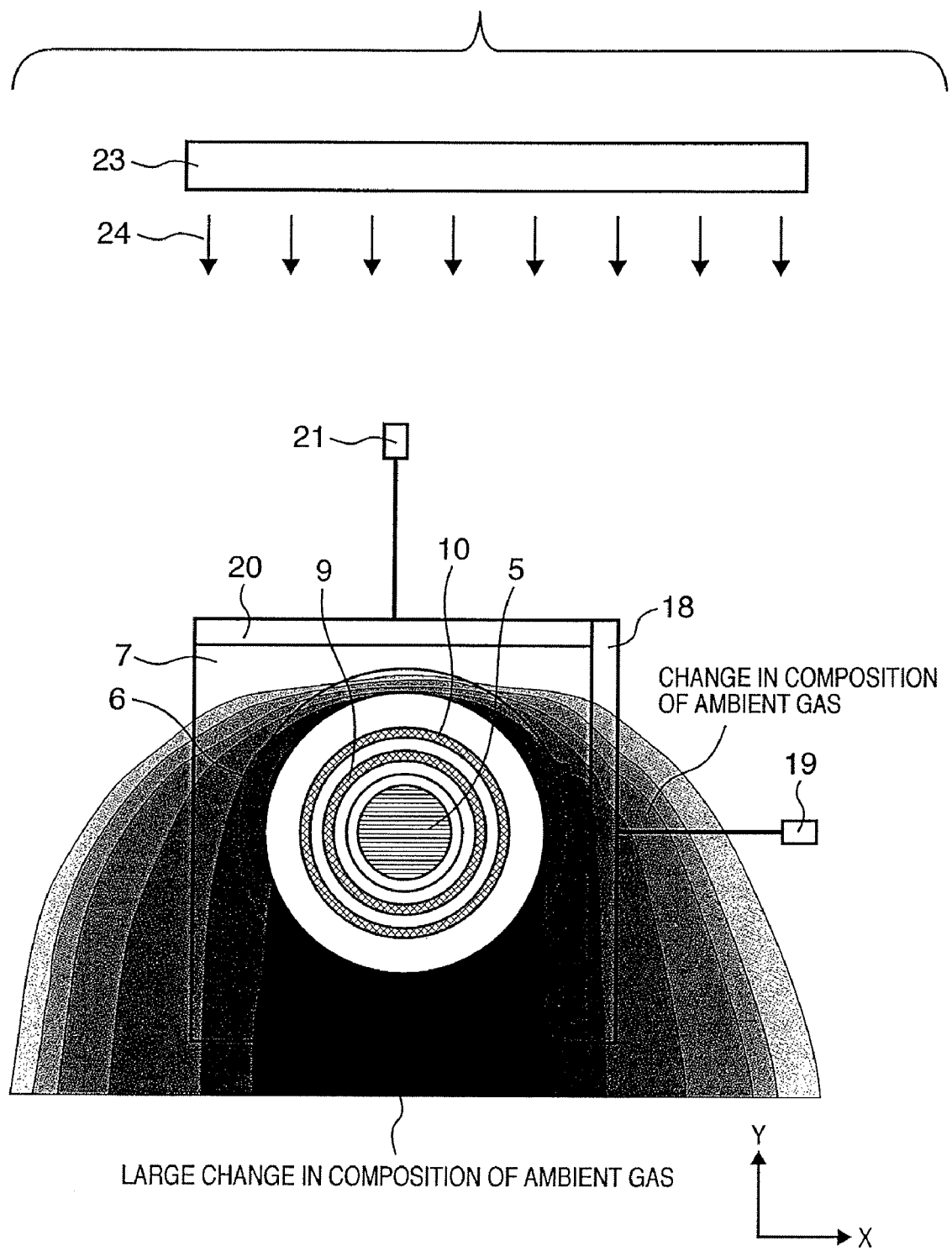
FIG. 15 is a schematic view showing a change in composition of an ambient gas around the measurement optical paths of an X-direction laser interferometer and a Y-direction laser interferometer.
Figure 16:
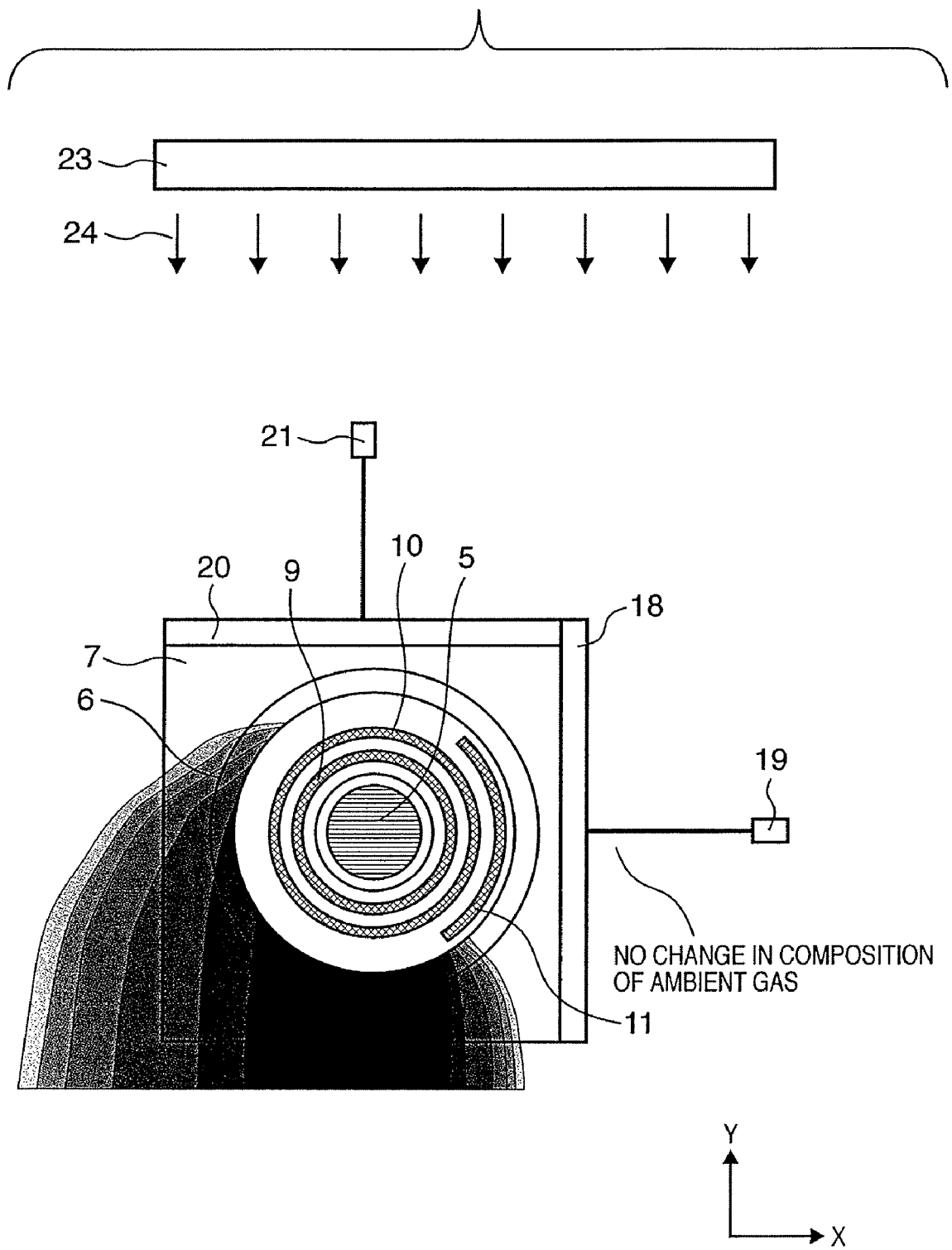
FIG. 16 is a schematic view showing a change in composition of an ambient gas around the measurement optical paths of the X-direction laser interferometer and Y-direction laser interferometer.
Figure 17A:
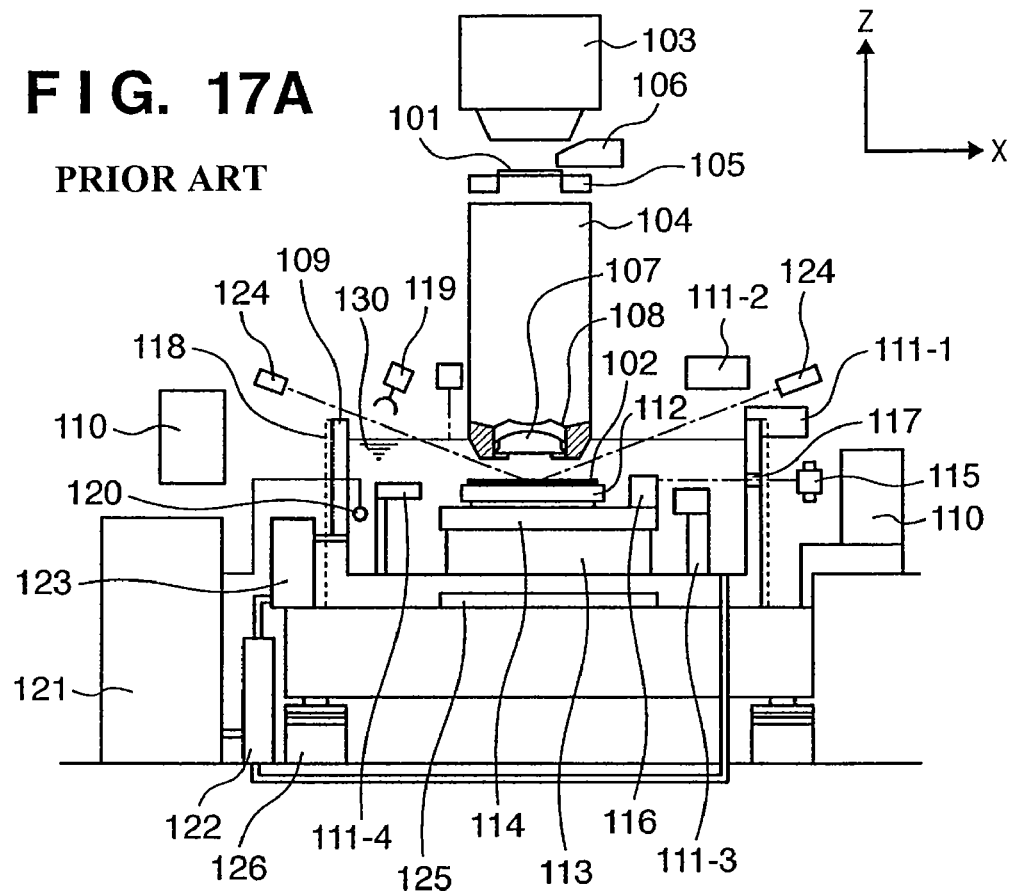
FIGS. 17A to 17C are side views illustrating a conventional liquid immersion type exposure apparatus.
Figure 17B:
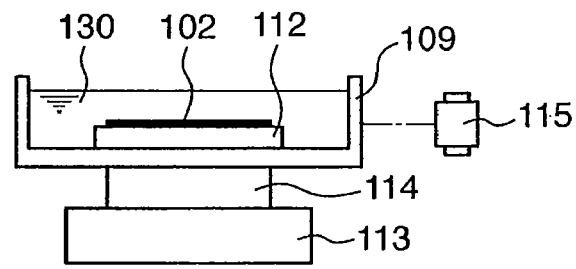
Figure 17C:
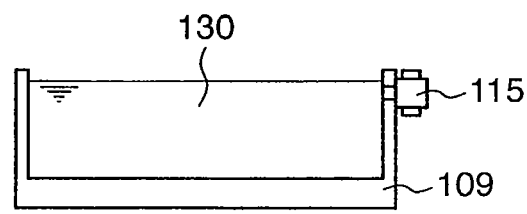
Figure 18:
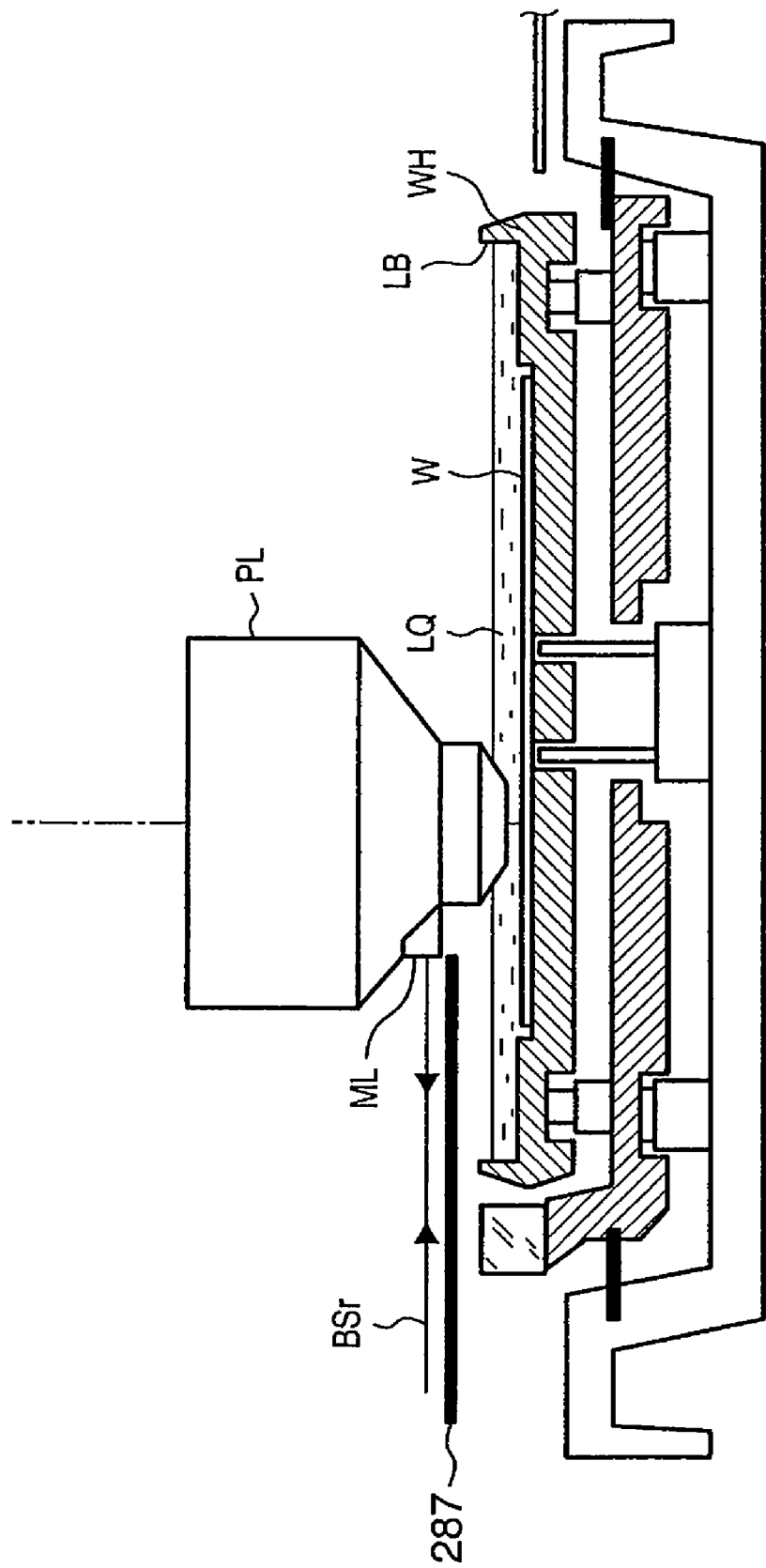
FIG. 18 is a side view illustrating the conventional liquid immersion type exposure apparatus.

FIGS. 15 and 16 are plan views of the vicinity of the wafer stage 7 when cut away on the upper side from the optical element 5. FIGS. 15 and 16 are schematic views showing a change in composition of the ambient gas around the measurement optical paths of the X-direction laser interferometer 19 and Y-direction laser interferometer 21, due to the presence of a current of the conditioned gas 24 blown from the conditioner 23. A deeper color indicates a larger change in composition of the ambient gas. A lighter color indicates a smaller change in composition of the ambient gas. White indicates no change in composition of the ambient gas. FIG. 15 is a schematic view showing a change in composition of the ambient gas when the exposure apparatus does not have the second supply nozzle 11. FIG. 16 is a schematic view showing a change in composition of the ambient gas, when the exposure apparatus has the second supply nozzle 11.

As shown in FIGS. 15 and 16, when the conditioner 23 faces the reflection surface of the Y-direction measurement mirror 20, the current of the conditioned gas 24 blown from the conditioner 23 provides the ability to sweep away the vapor of the liquid to the downwind side. No change, therefore, occurs in composition of the ambient gas on the measurement optical path of the Y-direction laser interferometer 21. However, when the exposure apparatus does not have the second supply nozzle 11, the vapor leaks out onto the measurement optical path of the X-direction laser interferometer 19, resulting in a steep distribution, i.e., change of the composition of the ambient gas on the measurement optical path of the X-direction laser interferometer 19, as shown in FIG. 15. Consequently, a change occurs in the refractive index of the ambient gas on the measurement optical path of the X-direction laser interferometer 19.

On the other hand, as shown in FIG. 16, when the second supply nozzle 11 is partially arranged near the X-direction measurement mirror 18, the gas supplied from the second supply nozzle 11 can form the gas curtain, so as to form a current of the gas from the second supply nozzle 11 to the first recovery nozzle 10. This makes it possible to prevent the vapor produced from the liquid from leaking out onto the measurement optical path of the X-direction laser interferometer 19. No change, therefore, occurs in ambient gas on the measurement optical path of the X-direction laser interferometer. It is, therefore, possible to prevent a change in refractive index of the ambient gas on the measurement optical path of the X-direction laser interferometer 19, so as to prevent the vapor of the liquid from influencing the ambient gas on the measurement optical path of the laser interferometer.

The case in which the conditioner 23 faces the reflection surface of the Y-direction measurement mirror 20, and the second supply nozzle 11 is arranged near the X-direction measurement mirror 18 has been exemplified with reference to FIG. 16. However, it is possible to obtain a similar effect even when the conditioner 23 faces the reflection surface of the X-direction measurement mirror 18, and the second supply nozzle 11 is arranged near the Y-direction measurement mirror 20.

When the second recovery nozzle 25 surrounds the second supply nozzle 11, as in modes 3 to 5, or when the second recovery nozzle 25 substitutes for the second supply nozzle 11, as in modes 6 and 7, the positional relationship between the conditioner 23 and the second supply nozzle 11 shown in FIG. 16 may be applied to the second recovery nozzle 25 in place of the second supply nozzle 11.

When the wafer stage 7 or the second wall portion 29 has the second supply nozzle 11, as in the exposure apparatuses from modes 10, 11 and 13, the positional relationship between the conditioner 23 and the second supply nozzle 11 shown in FIG. 16 may be applied to the second supply nozzle 11 and the second wall portion 29. When the wafer stage 7 or the second wall portion 29 has the second recovery nozzle 25 in place of the second supply nozzle 11 as in modes 12 and 14, the positional relationship between the conditioner 23 and the second supply nozzle 11 in FIG. 16 may be applied to the second recovery nozzle 25 and the second wall portion 29.

Mode 16 hereinafter will describe the case in which the exposure apparatus according to mode 15 adopts, as the gas supplied from the second supply nozzle 11, the same gas as the conditioned gas blown from the conditioner.

(Mode 16)

An exposure apparatus according to this mode comprises a conditioner which blows a gas into the space around a stage which holds a substrate. The conditioner controls the gas supplied from the second supply nozzle to have the same composition, temperature, and humidity as those of the conditioned gas blown from the conditioner.

As described above, the exposure apparatus uses, as the gas supplied from the second supply nozzle, a gas controlled to have the same composition, temperature, and humidity as those of the gas blown from the conditioner. Even when the gas supplied from the second supply nozzle leaks out onto the measurement optical path of the laser interferometer, the leaked gas has the same composition, temperature, and humidity as those of the ambient gas on the measurement optical path of the laser interferometer. No changes, therefore, occur in composition, temperature, and humidity of the ambient gas on the measurement optical path of the laser interferometer. It is, therefore, possible to prevent a change in refractive index of the ambient gas on the measurement optical path of the laser interferometer.

Mode 17 hereinafter will describe the case in which the exposure apparatus according to mode 15 adopts, as the gas supplied from the second supply nozzle, a gas having a lower humidity than the conditioned gas blown from the conditioner.

(Mode 17)

An exposure apparatus according to this mode comprises a conditioner, which blows a gas into the space around a stage, which holds a substrate. The conditioner controls the gas supplied from the second supply nozzle to have the same composition and temperature as those of the gas blown from the conditioner. The gas supplied from the second nozzle is a gas controlled to have a humidity lower than that of the conditioned gas blown from the conditioner.

As described above, the exposure apparatus adopts, as the gas supplied from the second supply nozzle, a gas controlled to have the same composition and temperature as those of the gas blown from the conditioner and to have a lower humidity than the gas blown from the conditioner. With this control, the vapor of the liquid flows from the first recovery nozzle to the second supply nozzle due to molecular diffusion. Even if the humidity of the gas supplied from the second supply nozzle rises, it is possible to reduce a change in humidity of the ambient gas on the measurement optical path of the lager interferometer. This makes it possible to reduce a change in refractive index of the ambient gas.

Mode 18 hereinafter will describe the case in which the exposure apparatuses according to modes 15 to 17 control the humidity of the gas supplied from the second supply nozzle.

(Mode 18)

An exposure apparatus according to this mode is designed to arrange, near the measurement optical path of the X-direction interferometer and/or the measurement optical path of the Y-direction interferometer, one or more humidity sensors to measure the humidity of a gas. On the basis of the measurement result obtained by the sensor, the exposure apparatus controls the humidity of the gas supplied from the second supply nozzle, so that the humidity in the vicinity of the measurement optical path of the X-direction interferometer and/or the measurement optical path of the Y-direction interferometer, becomes a predetermined value.

As described above, when the exposure apparatus comprises the humidity sensor to measure the humidity of the vicinity of the X-direction or Y-direction measurement optical path, to control the humidity on that measurement optical path, it is possible to always maintain the humidity of the ambient gas on the measurement optical path of the laser interferometer to be constant. This makes it possible to more surely prevent the vapor of the liquid from influencing the ambient gas on the measurement optical path of the laser interferometer.

[Device Manufacturing Method]

A practical example of a device manufacturing method using the above-described exposure apparatus will be explained next.

Figure 19:
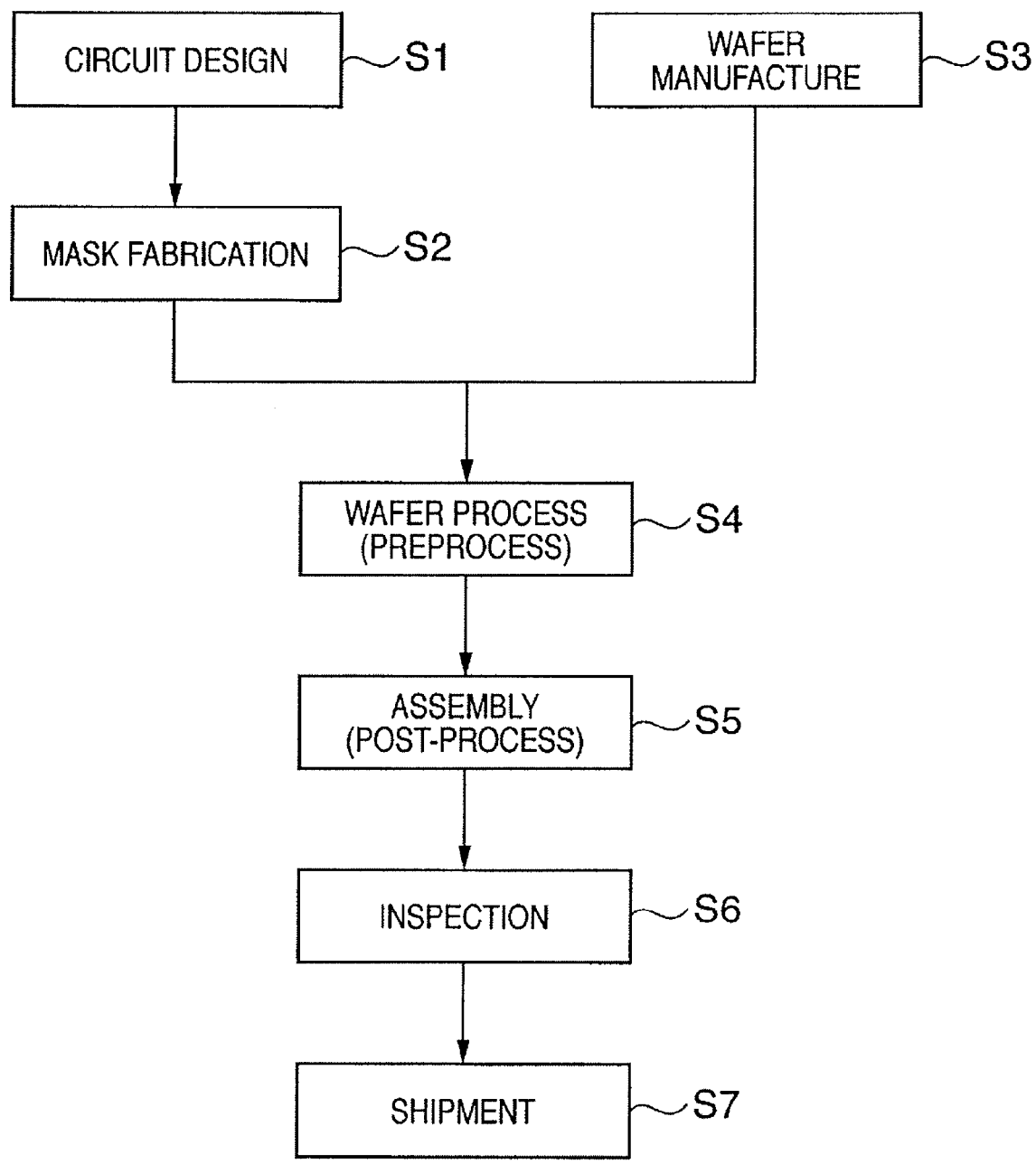
FIG. 19 is a flowchart for explaining the procedure for manufacturing a microdevice.

FIG. 19 shows the procedure for manufacturing a device, such as a microdevice (e.g., a semiconductor chip such as an IC or an LSI, a liquid crystal panel, a CCD, a thin-film magnetic head, or a micromachine).

In step S1 (circuit design), the circuit of a device is designed. In step S2 (mask fabrication), a mask (also called an original plate or reticle) is fabricated on the basis of the designed circuit pattern. In step S3 (wafer manufacture), a wafer (also called a substrate) is manufactured using a material such as silicon. In step S4 (wafer process), called a pre-process, the above-described exposure apparatus forms an actual circuit on the wafer by lithography using the mask and wafer. In step S5 (assembly), called a post-process, a semiconductor chip is formed from the wafer manufactured in step S4. This step includes processes, such as assembly (dicing and bonding) and packaging (chip encapsulation). In step S6 (inspection), inspections including an operation check test and a durability test of the semiconductor device manufactured in step S5 are performed. A semiconductor device is completed with these processes and shipped in step S7.

Figure 20:
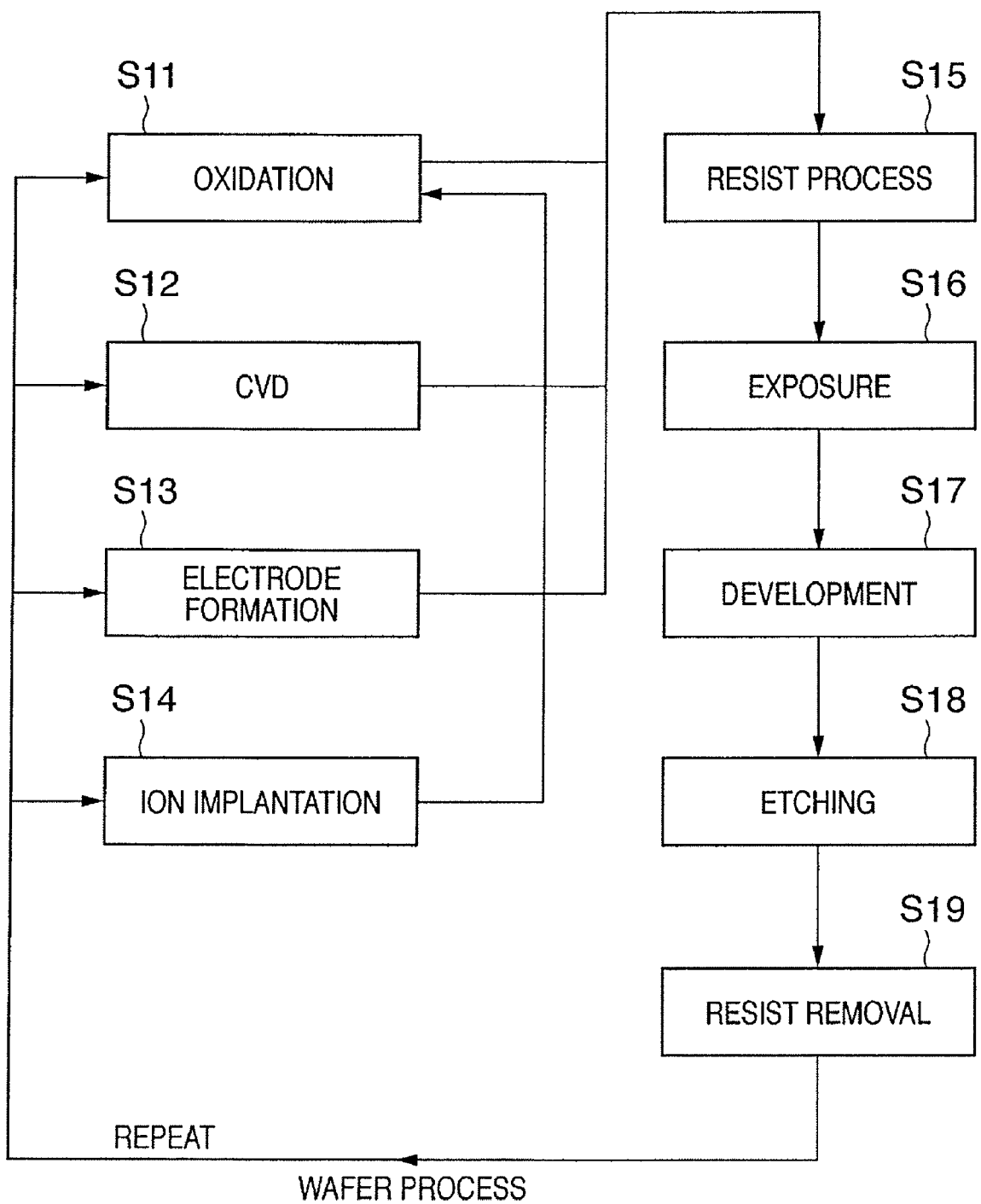
FIG. 20 is a flowchart for explaining the wafer process.

FIG. 20 shows the detailed procedure of the wafer process. In step S11 (oxidation), the surface of the wafer is oxidized. In step S12 (CVD), an insulating film is formed on the wafer surface. In step S13 (electrode formation), an electrode is formed on the wafer by deposition. In step S14 (ion implantation), ions are implanted into the wafer. In step S15 (resist process), a photosensitive agent is applied to the wafer. In step S16 (exposure), the above-described exposure apparatus exposes the wafer to light via the mask having the circuit pattern. In step S17 (development), the exposed wafer is developed. In step S18 (etching), portions other than the developed resist image are etched. In step S19 (resist removal), any unnecessary resist remaining after etching is removed. By repeating these steps, a multilayered structure of circuit patterns is formed on the wafer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An exposure apparatus which has a function of measuring a position of a stage configured to hold a substrate using a laser interferometer and exposes the substrate through an original and an optical element opposite to the substrate, with a gap between the optical element and the substrate filled with a liquid, said apparatus comprising:
   a first supply nozzle arranged around the optical element and configured to supply the liquid to the gap;
   a first recovery nozzle arranged around said first supply nozzle and configured to recover the liquid from the gap;
   a second supply nozzle configured to supply a gas outside said first recovery nozzle;
   a controller configured to control an amount of the liquid supplied from said first supply nozzle and an amount of the liquid and gas recovered from said first recovery nozzle; and
   a wall portion arranged around the optical element and substantially parallel to a surface of the substrate,
   wherein letting Q1 be an amount of the liquid supplied from said first supply nozzle and Q2 be a sum of the amount of the liquid and gas recovered from said first recovery nozzle, said controller controls operation to satisfy a relationship Q1<Q2 and to form a current of the gas from said second supply nozzle to said first recovery nozzle, and
   said second supply nozzle is arranged at the stage, so as to surround the substrate, to form a gas curtain outside said first recovery nozzle by supplying the gas to said wall portion and to partition the gap containing a vapor produced from the liquid and a space around the gap with the gas curtain and said wall portion.

2. A method of manufacturing a device, said method comprising steps of:
   exposing a substrate to light via a reticle using an exposure apparatus as defined in claim 1;
   developing the exposed substrate; and
   processing the developed substrate to manufacture the device.

3. The apparatus according to claim 1, further comprising:
   a measurement unit configured to detect the position of the stage; and
   a position detection unit configured to detect a position of an exposure surface of the substrate with respect to a focus position of the optical element,
   wherein a member configured to transmit measurement light of said measurement unit and measurement light of said position detection unit is arranged to said wall portion through which the measurement light of said measurement unit and the measurement light of said position detection unit are transmitted.

4. An exposure apparatus which has a function of measuring a position of a stage for holding a substrate using a laser interferometer and exposes the substrate through an original and an optical element opposite to the substrate, with a gap between the optical element and the substrate filled with a liquid, the stage being configured to hold the substrate and to be drivable in an X-direction and a Y-direction orthogonal to each other, said apparatus comprising:
   a first supply nozzle arranged around the optical element and configured to supply the liquid to the gap;
   a first recovery nozzle arranged around said first supply nozzle and configured to recover the liquid from the gap;
   a second supply nozzle configured to supply a gas outside said first recovery nozzle;
   a controller configured to control an amount of the liquid supplied from said first supply nozzle and an amount of the liquid and gas recovered from said first recovery nozzle;
   an X-direction laser interferometer configured to measure the X-direction position of the stage;
   a Y-direction laser interferometer configured to measure the Y-direction position of the stage;
   a first reflection mirror arranged on the stage and configured to reflect measurement light radiated from said X-direction laser interferometer;
   a second reflection mirror arranged on the stage and configured to reflect measurement light radiated from said Y-direction laser interferometer; and
   a conditioner configured to blow a conditioned gas from a direction facing one of said first reflection mirror and said second reflection mirror,
   wherein letting Q1 be an amount of the liquid supplied from said first supply nozzle, and Q2 be a sum of the amount of the liquid and gas recovered from said first recovery nozzle, said controller controls operation to satisfy a relationship Q1<Q2 and to form a current of the gas from said second supply nozzle to said first recovery nozzle, and
   said second supply nozzle is arranged only adjacent to one of said first reflection mirror and said second reflection mirror, which one does not face said conditioner, and said second supply nozzle is not arranged adjacent to the other of said first reflection mirror and said second reflection mirror, which faces said conditioner.

5. The apparatus according to claim 4, wherein the gas supplied from said second supply nozzle is controlled to have the same composition and temperature as those of the conditioned gas blown from said conditioner, and to have a lower humidity than the conditioned gas blown from said conditioner.

6. The apparatus according to claim 4, wherein said second supply nozzle is arranged adjacent to said first recovery nozzle and to the most outer side of said exposure apparatus.

* * * * *